United States Patent
Nozawa et al.

(10) Patent No.: US 9,343,270 B2
(45) Date of Patent: May 17, 2016

(54) PLASMA PROCESSING APPARATUS

(71) Applicant: TOKYO ELECTRON LIMITED, Tokyo (JP)

(72) Inventors: Toshihisa Nozawa, Sendai (JP); Jun Yoshikawa, Sendai (JP); Michitaka Aita, Sendai (JP); Masahiro Yamazaki, Sendai (JP); Takehisa Saito, Miyagi (JP); Fumihiko Kaji, Sendai (JP); Koji Yamagishi, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 103 days.

(21) Appl. No.: 14/187,466

(22) Filed: Feb. 24, 2014

(65) Prior Publication Data

US 2014/0238607 A1 Aug. 28, 2014

(30) Foreign Application Priority Data

Feb. 25, 2013 (JP) ................................ 2013-035146
Sep. 5, 2013 (JP) ................................ 2013-183555
Jan. 8, 2014 (JP) ................................ 2014-001936

(51) Int. Cl.
  *C23C 16/00* (2006.01)
  *C23F 1/00* (2006.01)
  (Continued)

(52) U.S. Cl.
  CPC ....... *H01J 37/32192* (2013.01); *H01J 37/3244* (2013.01); *H01J 37/32229* (2013.01)

(58) Field of Classification Search
  USPC ................ 156/345.36, 345.41; 118/723 MW, 118/723 R, 723 ME
  See application file for complete search history.

(56) References Cited

U.S. PATENT DOCUMENTS 5,134,965 A * 8/1992 Tokuda .............. C23C 16/45502
                                                              118/715
5,182,495 A * 1/1993 Fukuda ............. H01J 37/32192
                                                              204/298.37

(Continued)

FOREIGN PATENT DOCUMENTS

JP         3169134 U      7/2011
JP      2012-528452 A    11/2012

(Continued)

OTHER PUBLICATIONS

Reason for Rejections mailed Oct. 7, 2014 in corresponding Japanese Patent Application No. 2014-001936 (with an English translation) (6 pages).

*Primary Examiner* — Rakesh Dhingra
(74) *Attorney, Agent, or Firm* — Rothwell, Figg, Ernst & Manbeck, P.C.

(57) ABSTRACT

A plasma processing apparatus includes a processing chamber configured to partition a processing space and a microwave generator configured to generate microwaves for plasma excitation. Further, the plasma processing apparatus includes a dielectric member mounted in the processing chamber so as to seal the processing space, and configured to introduce the microwaves generated by the microwave generator into the processing space. Further, the plasma processing apparatus includes an injector mounted in the dielectric member, and configured to supply the processing gas made in a plasma state due to the microwaves to the processing space through a through-hole formed in the dielectric member. Further, the plasma processing apparatus includes a waveguide plate made of a dielectric material mounted in the injector so as to surround the through-hole of the dielectric member, and configured to guide the microwaves propagated into the dielectric member toward the through-hole to an inside of the injector.

9 Claims, 21 Drawing Sheets

(51) Int. Cl.
*H01L 21/306* (2006.01)
*H01J 37/32* (2006.01)

(56) References Cited

U.S. PATENT DOCUMENTS

| | | | | |
|---|---|---|---|---|
| 5,734,143 A * | 3/1998 | Kawase | ............ | H01J 37/32229 204/298.38 |
| 6,433,298 B1 * | 8/2002 | Ishii | ................ | H01J 37/32192 118/723 MW |
| 2004/0221800 A1 * | 11/2004 | Yanase | ............. | H01J 37/32192 117/103 |
| 2005/0172901 A1 * | 8/2005 | Ishibashi | ........... | H01J 37/32238 118/723 I |
| 2005/0276928 A1 * | 12/2005 | Okumura | .......... | H01J 37/32009 427/446 |
| 2011/0048642 A1 * | 3/2011 | Mihara | ............. | H01J 37/32192 156/345.34 |

FOREIGN PATENT DOCUMENTS

| | | |
|---|---|---|
| JP | 2012-238845 A | 12/2012 |
| KR | 10-0991164 B1 | 11/2010 |
| KR | 10-2012-0120911 A | 11/2012 |
| WO | 2010/138103 A1 | 12/2010 |

* cited by examiner

PLASMA PROCESSING APPARATUS

CROSS-REFERENCE TO RELATED APPLICATIONS

This application is based on and claims priority from Japanese Patent Application Nos. 2013-035146, 2013-183555 and 2014-001936, filed on Feb. 25, 2013, Sep. 5, 2013 and Jan. 8, 2014, respectively, with the Japan Patent Office, the disclosures of which are incorporated herein in their entireties by reference.

TECHNICAL FIELD

The present disclosure relates to a plasma processing apparatus.

BACKGROUND

In a process of manufacturing a semiconductor, plasma processing for depositing, etching, or the like of a thin film has been widely conducted. In the recent plasma processing, a plasma processing apparatus using a microwave has been often used to make processing gas be in a plasma state.

The plasma processing apparatus using the microwave uses a microwave generator to generate a microwave for plasma excitation. Further, the plasma processing apparatus induces the microwave for plasma excitation into a processing space using a dielectric member which is mounted in the processing chamber to seal the processing space. Further, the plasma processing apparatus supplies the processing gas to the processing space through a through-hole formed in the dielectric member using an injector which is mounted in the dielectric member. The injector and the through-hole of the dielectric member construct a path (hereinafter, appropriately referred to as a 'gas supplying path') through which the processing gas is supplied to the processing space. The processing gas supplied from the gas supplying path to the processing space is in a plasma state due to the microwave introduced into the processing space through the dielectric member.

However, in the plasma processing apparatus, the microwave intrudes into the gas supplying path for supplying the processing gas to the processing space to increase electric field intensity, and therefore it is required to suppress the microwave from intruding into the gas supplying path. Japanese Patent Laid-Open Publication No. 2012-238845 discloses that a conductive electric field shielding member is mounted around the injector, which is a portion of the gas supplying path, to shield the microwave from intruding into the gas supplying path using the electric field shielding member.

SUMMARY

The present disclosure provides a plasma processing apparatus including a processing chamber configured to partition a processing space; a microwave generator configured to generate microwaves for plasma excitation; a dielectric member mounted in the processing chamber so as to seal the processing space, and configured to introduce the microwaves generated by the microwave generator into the processing space; an injector mounted in the dielectric member, and configured to supply the processing gas made in a plasma state due to the microwaves to the processing space through a through-hole formed in the dielectric member; and a waveguide plate mounted in the injector so as to surround the through-hole of the dielectric member, and configured to guide the microwaves propagated into the dielectric member toward the through-hole to an inside of the injector made of a dielectric material.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
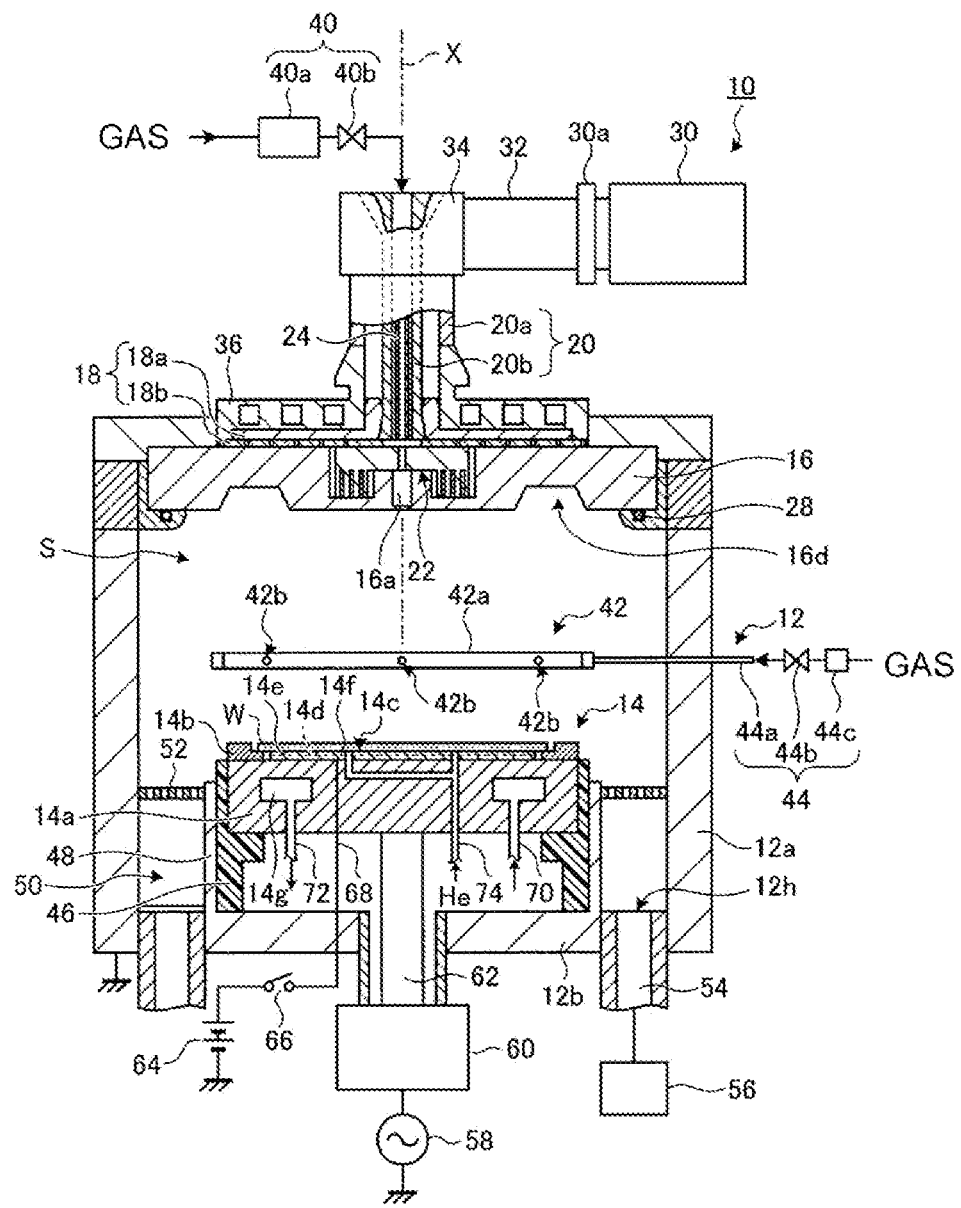
FIG. 1 is a cross-sectional view schematically illustrating a plasma processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

However, as in the related art, since the generation of the microwave intruding into the gas supplying path by climbing over the electric field shielding member is not prevented only by shielding the microwave from intruding into the gas supplying path using the conductive electric field shielding member, the electric field intensity of the gas supplying path may be increased. When the electric field intensity of the gas supplying path is excessively increased, abnormal discharge may occur in the gas supplying path.

A plasma processing apparatus according to an aspect of the present disclosure includes a processing chamber configured to partition a processing space; a microwave generator configured to generate microwaves for plasma excitation; a dielectric member mounted in the processing chamber so as to seal the processing space, and configured to introduce the microwaves generated by the microwave generator into the processing space; an injector mounted in the dielectric member, and configured to supply the processing gas made in a plasma state due to the microwaves to the processing space through a through-hole formed in the dielectric member; and a waveguide plate mounted in the injector so as to surround the through-hole of the dielectric member, and configured to guide the microwaves propagated into the dielectric member toward the through-hole to an inside of the injector made of a dielectric material.

Several aspects and exemplary embodiments of the present disclosure provide a plasma processing apparatus capable of reducing electric field intensity of a path through which processing gas in a plasma state is supplied.

Hereinafter, exemplary embodiments of a plasma processing apparatus and a plasma processing method disclosed with reference to the accompanying drawings will be described in detail. Meanwhile, in each drawing, same or corresponding parts are denoted by same reference numerals.

The disclosed plasma processing apparatus according to one exemplary embodiment includes a processing chamber configured to partition a processing space; a microwave generator configured to generate microwaves for plasma excitation; a dielectric member mounted in the processing chamber so as to seal the processing space, and configured to introduce the microwaves generated by the microwave generator into the processing space; an injector mounted in the dielectric member, and configured to supply the processing gas made in a plasma state due to the microwaves to the processing space through a through-hole formed in the dielectric member; and a waveguide plate mounted in the injector so as to surround the through-hole of the dielectric member, and configured to guide the microwaves propagated into the dielectric member toward the through-hole to an inside of the injector made of a dielectric material.

In the disclosed plasma processing apparatus according to one exemplary embodiment, the dielectric member is provided with receiving concave parts which are formed on a surface opposite to a surface sealing the processing space of the dielectric member to receive the injector, the through-hole through which the receiving concave part is communicated with the processing space, and a groove part which is formed in the receiving concave part to surround the through-hole, the injector is provided with a body part in which the through-hole of the dielectric member is provided with a through-hole for supplying the processing gas and a protruding part which protrudes from the body part toward the groove part of the dielectric member, and the waveguide plate is buried in the protruding part of the injector to be disposed inside the injector so as to surround the through-hole of the dielectric member.

In the disclosed plasma processing apparatus according to one exemplary embodiment, the dielectric member is provided with a second groove part which is formed on a surface sealing the processing space of the dielectric member so as to surround the through-hole of the dielectric member.

In the disclosed plasma processing apparatus according to one exemplary embodiment, the waveguide plate is disposed in plural inside the injector along a direction away from the through-hole of the dielectric member.

In the disclosed plasma processing apparatus according to one exemplary embodiment, at least one of the plurality of waveguide plates has a height different from that of another waveguide plate which is adjacent to the at least one waveguide plate.

In the disclosed plasma processing apparatus according to one exemplary embodiment, at least one of the plurality of waveguide plates has a thickness different from that of another waveguide plate which is adjacent to the at least one waveguide plate.

In the disclosed plasma processing apparatus according to one exemplary embodiment, at least one pair of waveguide plates of the plurality of waveguide plates has an interval different from that of another pair of waveguide plates which is adjacent to the at least one pair of waveguide plates.

In the disclosed plasma processing apparatus according to one exemplary embodiment, each of the waveguide plates includes a plurality of fragments adjacent to each other at a predetermined gap along a direction going around the circumference of the through-hole of the dielectric member, in which each of the fragments is disposed at positions shielding the gaps between the fragments included in other waveguide plates.

In the disclosed plasma processing apparatus according to one exemplary embodiment, when a wavelength of the microwave propagated into the waveguide plate is set to be $\lambda$, a height of the waveguide plate is $\lambda/4$.

In the disclosed plasma processing apparatus according to one exemplary embodiment, when the wavelength of the microwave propagated into the waveguide plate is set to be $\lambda$, the height of the waveguide plate is between $\lambda/8$ and $4/\lambda$.

The disclosed plasma processing apparatus according to one exemplary embodiment includes a processing chamber configured to partition a processing space; a microwave generator configured to generate microwaves for plasma excitation; a dielectric member mounted in the processing chamber so as to seal the processing space, and configured to introduce the microwaves generated by the microwave generator into the processing space; and an injector mounted in the dielectric member, and configured to supply the processing gas made in a plasma state due to the microwaves to the processing space through a through-hole formed in the dielectric member, in which a surface sealing the processing space of the dielectric member is provided with a groove part formed to surround the through-hole of the dielectric member.

In the disclosed plasma processing apparatus according to one exemplary embodiment, the through-hole is formed in a member which is detachably attached to the dielectric member and is a portion of the dielectric member and is made of a dielectric substance.

(First Exemplary Embodiment)

FIG. 1 is a cross-sectional view schematically illustrating a plasma processing apparatus according to a first exemplary embodiment of the present disclosure. A plasma processing apparatus 10 illustrated in FIG. 1 includes a processing chamber 12, a stage 14, a dielectric member 16, an antenna 18, a coaxial waveguide 20, an injector 22, and a pipe member 24.

The processing chamber 12 partitions a processing space S in which plasma processing is performed on a substrate W to be processed. The processing chamber 12 may include a side wall 12a and a bottom portion 12b. The side wall 12a has approximately a cylindrical shape which extends in an X-axis direction. The bottom portion 12b is formed at a lower portion of the side wall 12a. The bottom portion 12b is provided with an exhaust-hole 12h for exhaust. An upper end portion of the side wall 12a is opened.

An opening of the upper end portion of the side wall 12a is closed by the dielectric member 16 which is also called a dielectric window. The dielectric member 16 is mounted in the processing vessel 12 to seal the processing space S. An O ring 28 may be inserted between the dielectric member 16 and the upper end portion of the side wall 12a. The processing chamber 120 is more certainly sealed by the O ring 28.

The plasma processing apparatus 10 may also include a microwave generator 30. The microwave generator 30 generates a microwave of, for example, 2.45 GHz frequency. The microwave generator 30 includes a tuner 30a. The microwave generator 30 is connected to an upper portion of the coaxial waveguide 20 through a waveguide 32 and a mode converter 34.

The coaxial waveguide 20 extends along the X axis. The coaxial waveguide 20 includes an outer conductor 20a and an inner conductor 20b. The outer conductor 20a has a cylindrical shape which extends in an X-axis direction. A lower end of the outer conductor 20a may be electrically connected to an upper portion of a cooling jacket 36. The inner conductor 20b is mounted inside the outer conductor 20a. The inner conductor 20b extends along the X axis. A lower end of the inner conductor 20b is connected to a slot plate 18b of the antenna 18.

The antenna 18 includes a dielectric plate 18a and the slot plate 18b. The dielectric plate 18a has approximately a disk shape. The dielectric plate 18a may be made of, for example, quartz or alumina. The dielectric plate 18a is sandwiched between the slot plate 18b and a lower surface of the cooling jacket 36. Therefore, the antenna 18 may be configured of the dielectric plate 18a, the slot plate 18b, and the lower surface of the cooling jacket 36.

The slot plate 18b is approximately a disc-shaped metal plate on which a plurality of slots is formed. In the present exemplary embodiment, the antenna 18 may be a radial line slot antenna. That is, in the present exemplary embodiment, the slot plate 18b is provided with plural pairs of slots. Each pair of the slots includes two slots which extend in a direction intersecting each other or orthogonal to each other. The plural pairs of slots may be disposed in a diameter direction at a predetermined interval based on the X axis and may be disposed in a circumferential direction at a predetermined interval. The microwave generated by the microwave generator 30 passes through the coaxial waveguide 20, is propagated to the dielectric plate 18a, and is introduced into the dielectric member 16 from the slot of the slot plate 18b.

The dielectric member 16 has approximately a disk shape and is made of, for example, quartz or alumina. The dielectric member 16 is mounted to face a stage 14 in the X-axis direction and is mounted just below the slot plate 18b. The microwave received from the antenna 18 passes through the dielectric member 16 and is introduced into the processing space S. Therefore, an electric field is generated just below the dielectric member 16 to generate plasma within the processing space S. As such, the plasma processing apparatus 10 may generate the plasma using the microwave without applying a magnetic field.

According to the present exemplary embodiment, a lower surface of the dielectric member 16 may partition a concave part 16d. The concave part 16d is formed in an annular shape along a circumference of the X axis and has a taper shape. The concave part 16d is provided to promote a generation of a standing wave by the introduced microwave and may contribute to the efficient generation of plasma by the microwave.

In the plasma processing apparatus 10, the inner conductor 20b may have a cylindrical shape which extends along the X axis. An inside of the inner conductor 20b may be inserted with the pipe member 24. One end of the pipe member 24 is connected to a gas supplying system 40. The gas supplying system 40 may be configured of a flow controller 40a such as a mass flow controller and an opening and closing valve 40b. In the present exemplary embodiments, the processing gas from the gas supplying system 40 is supplied to the injector 22 through the pipe member 24. The injector 22 supplies the processing gas from the pipe member 24 to the through-hole 16a which is formed in the dielectric member 16. The processing gas supplied to the through-hole 16a of the dielectric member 16 is supplied to the processing space S. That is, the injector 22 supplies the processing gas to the processing space S through the through-hole 16a of the dielectric member 16. Meanwhile, the detailed contents of the injector 22 and the through-hole 16a of the dielectric member 16 will be described below.

In the present exemplary embodiment, the plasma processing apparatus 10 may further include a separate gas supplying part 42. The gas supplying part 42 includes a gas pipe 42a. The gas pipe 42a extends in an annular shape along the circumference of the X axis between the dielectric member 16 and the stage 14. The gas pipe 42a is provided with a plurality of gas injection-hole 42b which injects gas in a direction toward the X axis. The gas supplying part 42 is connected to a gas supplying system 44.

The gas supplying system 44 includes a gas pipe 44a, an opening and closing valve 44b, and a flow controller 44c such as the mass flow controller. The gas pipe 42a of the gas supplying part 42 is supplied with the processing gas through the flow controller 44c, the opening and closing valve 44b, and the gas pipe 44a. Meanwhile, the gas pipe 44a passes through the side wall 12a of the processing chamber 12. The gas pipe 42a of the gas supplying part 42 may be supported to the side wall 12a through the gas pipe 44a.

The stage 14 is mounted between the antenna 18 and the stage 14, having the processing space S disposed therebetween. The substrate W to be processed is disposed on the stage 14. In the present exemplary embodiment, the stage 14 may include a stand 14a, a focus ring 14b, and an electrostatic chuck 14c.

The stand 14a is supported to a cylindrical support part 46. The cylindrical support part 46 is made of an insulating material and extends vertically up from a bottom portion 12b. Further, an outer circumference of the cylindrical support part 46 is provided with a conductive cylindrical support part 48. The cylindrical support part 48 extends vertically up from the bottom portion 12 of the processing chamber 12 along the outer circumference of the cylindrical support part 46. An annular exhaust path 50 is formed between the cylindrical support part 46 and the side wall 12a.

An upper portion of the exhaust path 50 is attached with an annular baffle plate 52 on which the plurality of through-holes are formed. A lower portion of an exhaust-hole 12h is connected to an exhaust apparatus 56 through an exhaust pipe 54. The exhaust apparatus 56 has a vacuum pump such as a turbo molecular pump. The processing space S within the processing chamber 12 may be pressure-reduced up to a desired vacuum degree by the exhaust apparatus 56.

The stand 14a is also used as a high frequency electrode. The stand 14a is electrically connected to a high frequency power supply 58 for RF biasing through a matching unit 60 and a feeding rod 62. The high frequency power supply 58 outputs as predetermined power a high frequency power of a constant frequency, for example, 13.65 MHz appropriate to control energy of ions implanted into the substrate W to be processed. The matching unit 60 receives a matching machine which matches between impedance of the high frequency power supply 58 side and impedance of load sides such as an electrode, plasma, and the processing chamber 12. The matching machine includes a blocking capacitor for generating magnetic bias.

An upper surface of the stand 14a is provided with the electrostatic chuck 14c. The electrostatic chuck 14c keeps the substrate W to be processed with an electrostatic adsorption force. An outside of the diameter direction of the electrostatic chuck 14c is provided with the focus ring 14b which annularly surrounds the circumference of the substrate W to be processed. The electrostatic chuck 14c includes an electrode 14d, an insulating layer 14e, and an insulating layer 14f. The electrode 14d is configured of a conductive layer and is mounted between the insulating layer 14e and the insulating layer 14f. The electrode 14d is electrically connected to a high voltage DC power supply 64 through a switch 66 and a coated wire 68. The electrostatic chuck 14c may adsorb and keep the substrate W to be processed by a Coulomb's force which is generated by a DC voltage applied from the DC power supply 64.

An inside of the stand 14a is provided with an annular refrigerant chamber 14g which extends in a circumferential direction. The refrigerant chamber 14g is circulated and supplied with a refrigerant of a predetermined temperature, for example, cooling water through pipes 70 and 72 from a chiller unit (not illustrated). Heat transfer gas, for example, He gas of the electrostatic chuck 14c is supplied between an upper surface of the electrostatic chuck 14c and a rear surface of the substrate W to be processed through a gas supplying pipe 74 depending on the temperature of the refrigerant.

Figure 2:
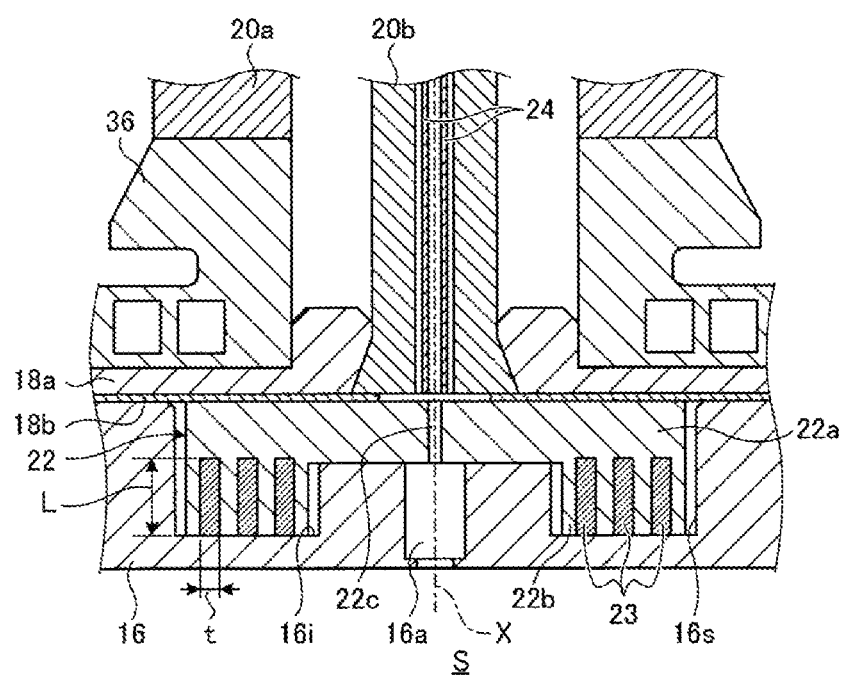
FIG. 2 is an enlarged cross-sectional view of an injector and a through-hole of a dielectric member according to the first exemplary embodiment of the present disclosure.
Figure 3:
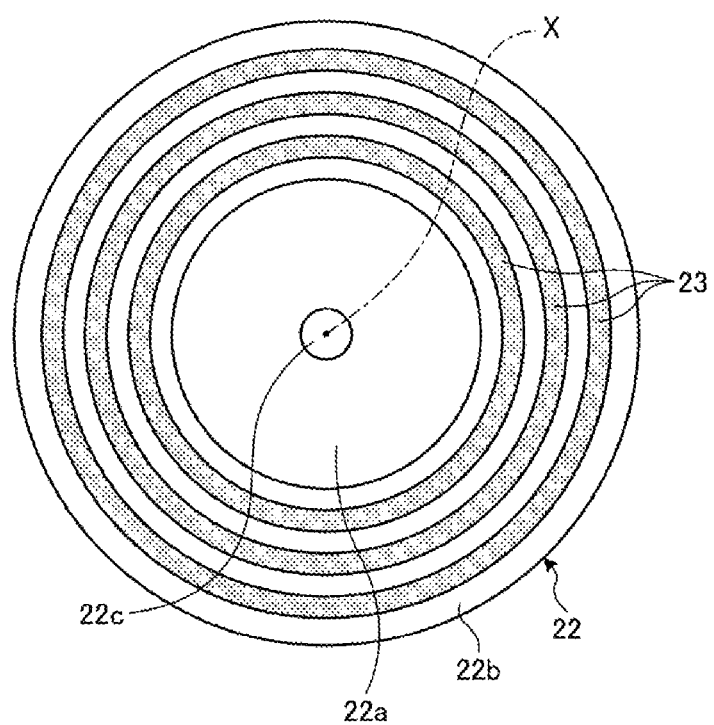
FIG. 3 is a plan view of the injector according to the first exemplary embodiment of the present disclosure which is viewed from an X-axis direction.

Herein, the injector 22 and the through-hole 16a of the dielectric member 16 will be described in more detail with reference to FIGS. 2 and 3. FIG. 2 is an enlarged cross-sectional view of an injector and a through-hole of a dielectric member according to the first exemplary embodiment of the present disclosure. FIG. 3 is a plan view of the injector according to the first exemplary embodiment of the present disclosure which is viewed from an X-axis direction.

As illustrated in FIGS. 2 and 3, the dielectric member 16 is sequentially provided with a receiving concave part 16s and the through-hole 16a from above along the X axis. The through-hole 16a communicates the receiving concave part 16s with the processing space S.

The receiving concave part 16s is formed on a surface opposite to the surface sealing the processing space S of the dielectric member 16. The receiving concave part 16s receives the injector 22. Further, the receiving concave part 16s is provided with an annular groove part 16i to surround the through-hole 16a. The groove part 16i is an example of a first groove part.

The injector 22 is received under a tip of the pipe member 24, in the receiving concave part 16s of the dielectric member 16. The injector 22 is made of a conductive material and is formed to have approximately a disk shape using the X axis as a central shaft. The injector 22 is made of, for example, aluminum or stainless.

The injector 22 has a body part 22a and a protruding part 22b. The body part 22a is provided with a through-hole 22c which extends from a surface of the pipe member 24 side to a surface of the through-hole 16a side. The through-hole 22c supplies the processing gas from the pipe member 24 to the through-hole 16a of the dielectric member 16. The protruding part 22b protrudes from the body part 22a toward the groove part 16i of the dielectric member 16. That is, the protruding part 22b made of a conductive material protrudes toward the groove part 16i of the dielectric member 16 enclosing the through-hole 16a, and thus serves as an electric field shielding member which shields the microwave propagated into the dielectric member 16 toward the through-hole 16a.

The inside of the injector 22 is provided with the waveguide plate 23. The waveguide plate 23 is made of a dielectric material and is formed to have approximately a cylindrical shape using the X axis as the central shaft. The waveguide plate 23 is made of, for example, alumina or quartz. The waveguide plate 23 is made of the same or different dielectric material as or from the dielectric material forming the dielectric member 16. For example, the dielectric member 16 and the waveguide plate 23 may be made of alumina. Further, the dielectric member 16 may be made of quartz and the waveguide plate 23 may be made of alumina.

The waveguide plate 23 is disposed inside the injector 22 to surround the through-hole 16a of the dielectric member 16. In detail, the waveguide plate 23 is buried in the protruding part 22b of the injector 22, and thus is disposed inside the injector 22 to surround the through-hole 16a of the dielectric member 16. In more detail, the waveguide plate 23 is buried into the protruding part 22b of the injector 22 in the state in which one end surface thereof is exposed to the groove part 16i of the dielectric member 16 and thus is disposed inside the injector 22 to surround the through-hole 16a of the dielectric member 16. One end surface exposed to the groove part 16i of the waveguide plate 23 may be disposed to contact the dielectric member 16. The waveguide plate 23 guides the microwave propagated into the dielectric member 16 toward the through-hole 16a from one end surface exposed to the groove part 16i of the dielectric member 16 to the other end surface of an inside of the injector 22. When the microwaves are guided to the inside of the injector 22 by the waveguide plate 23, the standing waves of the microwaves are generated inside the injector 22 and thus the microwaves offset each other. In other words, the microwave is guided to the inside of the injector 22 by the waveguide plate 23 and therefore hardly reaches the through-hole 16a of the dielectric member 16.

When the wavelength of the microwave propagated into the waveguide plate 23 is set to be $\lambda$, a height L of the waveguide plate 23 is $\lambda/4$. The height L of the waveguide plate 23 is a distance from one end surface of the waveguide plate 23 exposed to the groove part 16i of the dielectric member 16 to the other end surface of the waveguide plate 23 buried into the protruding part 22b of the injector 22. That is, the height L of the waveguide plate 23 is set to be $\lambda/4$ and thus a generation rate of the standing wave of the microwave guided to the inside of the injector 22 by the waveguide plate 23 is improved, such that the offset between the microwaves is promoted.

When the wavelength of the microwave propagated into the waveguide plate 23 is set to be $\lambda$, a thickness t of the waveguide plate 23 is between $\lambda/8$ and $\lambda/4$. That is, the thickness t of the waveguide plate 23 is between $\lambda/8$ and $\lambda/4$, such that the microwave is easily guided to the inside of the injector 22 through the waveguide plate 23.

The waveguide plate 23 is disposed inside the injector 22 in plural along a direction away from the through-hole 16a of the dielectric member 16. In more detail, the waveguide plate 23 is disposed inside the injector 22 in plural along the diameter direction of the disk-shaped injector 22. In the present exemplary embodiment, three waveguide plates 23 are disposed inside the injector 22 along the diameter direction of the disk-shaped injector 22. Each of the waveguide plates 23 guides the microwave propagated into the dielectric member 16 toward the inside in the diameter direction of the injector 22 to the inside of the injector 22. Therefore, the microwave propagated into the dielectric member 16 toward the inside in the diameter direction of the injector 22 hardly reaches the through-hole 16a of the dielectric member 16.

According to the present exemplary embodiment, the waveguide plate 23 is disposed inside the injector 22 to be able to suppress the increase in the microwave which reaches the through-hole 16a of the dielectric member 16. As the result, according to the present exemplary embodiment, electric field intensity of the through-hole 16a of the dielectric member 16 which is a path through which the processing gas in a plasma state is supplied may be reduced, such that it is possible to prevent abnormal discharge from occurring in the through-hole 16a.

According to the present exemplary embodiment, the waveguide plate 23 is buried into the protruding part 22b of the injector 22 which protrudes toward the groove part 16i of the dielectric member 16 and thus is disposed inside the injector 22. For this reason, according to the present exemplary embodiment, the microwave propagated into the dielectric member 16 toward the through-hole 16a may be guided to the inside of the injector 22 through the waveguide plate 23 while being shielded by the protruding part 22b of the injector 22. As the result, according to the present exemplary embodiment, the electric field intensity of the through-hole 16a of the dielectric member 16 which is the path through which the processing gas in the plasma state is supplied may be more and more reduced.

Meanwhile, the foregoing description describes an example of the exemplary embodiment in which the waveguide plate 23 is disposed inside the injector 22 in plural along the direction away from the through-hole 16a of the dielectric member 16, but the present exemplary embodiment is not limited thereto. Only one waveguide plate 23 may be disposed inside the injector 22.

Figure 4A:
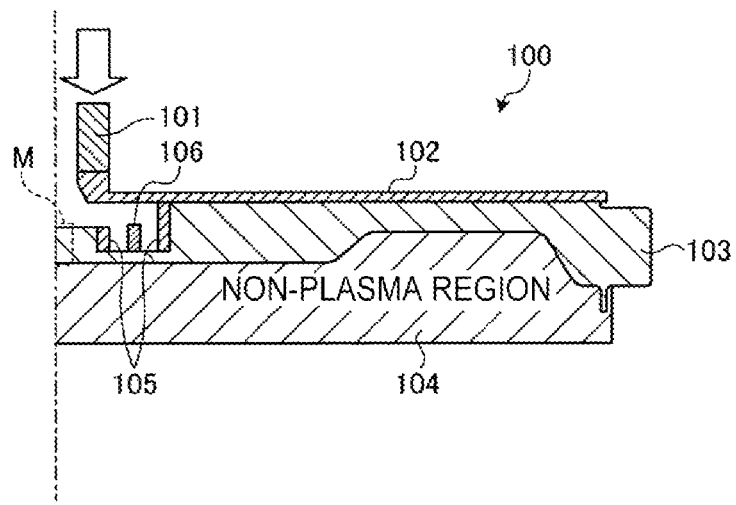
FIG. 4A is a diagram illustrating a simulation model according to the first exemplary embodiment of the present disclosure.
Figure 4B:
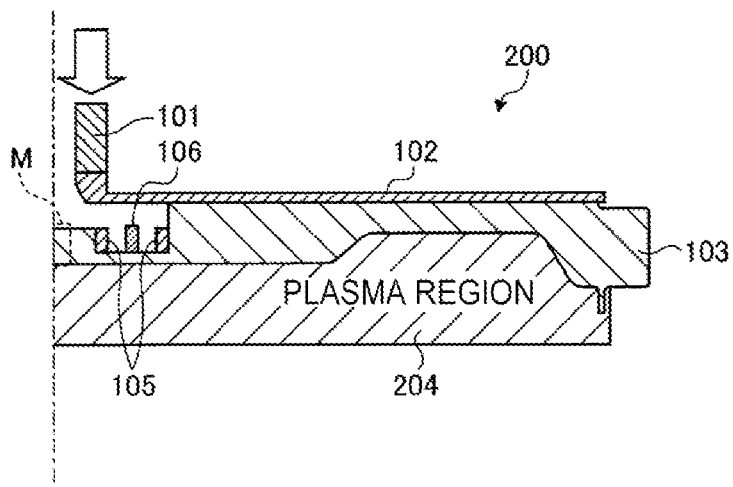
FIG. 4B is a diagram illustrating the simulation model according to the first exemplary embodiment of the present disclosure.

Next, an effect by the plasma processing apparatus 10 according to the first exemplary embodiment will be described with reference to FIGS. 4 to 10. Herein, prior to describing the effect (simulation result) by the plasma processing apparatus 10 according to the first exemplary embodiment, a simulation model in the first exemplary embodiment will be described. FIGS. 4A and 4B are diagrams illustrating the simulation model according to the first exemplary embodiment.

A simulation model 100 illustrated in FIG. 4A is a model corresponding to a right half of the cross-sectional view illustrated in FIG. 2. In detail, the simulation model 100 includes models 101 to 106. The model 101 is a model corresponding to a space between an outer conductor 20a and an inner conductor 20b. The model 102 is a model corresponding to the dielectric plate 18a of the antenna 18. The model 103 is a model corresponding to the dielectric member 16. The model 104 is a model corresponding to the processing space S. The model 105 is a model corresponding to the space between the receiving concave part 16s of the dielectric member 16 and the injector 22. The model 106 is a model corresponding to the waveguide plate 23.

As a simulation condition of the simulation model 100, a power of the microwave injected into the model 101, that is, a power of the microwave injected into the space between the outer conductor 20a and the inner conductor 20b is set to be 3000 W. Further, as the simulation condition of the simulation model 100, an electron density of the model 104, that is, an electron density of the processing space S is set to be 0 (number/m$^3$). That is, the simulation condition of the simulation model 100 shows that the microwave is absorbed into an interface between the model 103 corresponding to the dielectric member 16 and the model 104 corresponding to the processing space S.

The simulation model 200 illustrated in FIG. 4B is basically a model corresponding to the simulation model 100 illustrated in FIG. 4A. The simulation model 200 is different from the simulation model 100 in that the simulation model 200 includes a model 204 instead of the model 104 and in terms of the simulation condition applied to the model 204.

As the simulation condition of the simulation model 200, an electron density of the model 204, that is, an electron density of the processing space S is set to be 8.0 E+16 (number/m$^3$) or more. That is, the simulation condition of the simulation model 200 shows that the microwave is absorbed into an interface between the model 103 corresponding to the dielectric member 16 and the model 204 corresponding to the processing space S, and a portion of the microwave is reflected from the interface. Herein, it is assumed that plasma excited by the microwave is the dielectric material and a dielectric constant of plasma is calculated as a function of the electron density.

Meanwhile, as illustrated in FIGS. 4A and 4B, in the model 103 corresponding to the dielectric member 16, a measurement region M corresponding to the through-hole 16a of the dielectric member 16 is set as a region which is a target to measure the electric field intensity.

FIGS. 4A and 4B illustrate the case in which one waveguide plate 23 is disposed inside the injector 22 and therefore, the number of models 106 corresponding to the waveguide plate 23 is set to be one. In the case of simulating the case in which the waveguide plate 23 is not disposed inside the injector 22, the number of models 106 is set to be 0. Further, in the case of simulating the case in which two or more waveguide plates 23 are disposed inside the injector 22, the number of models 106 is set to be equal to or more than 2.

Figure 5A:
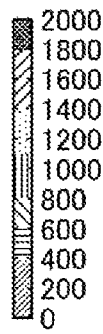
FIG. 5A is a diagram illustrating an effect (simulation result of electric field intensity depending on the number of waveguide plates) by the plasma processing apparatus according to the first exemplary embodiment of the present disclosure.
Figure 5A:
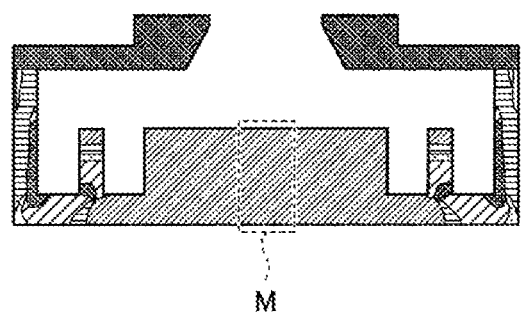
Figure 5B:
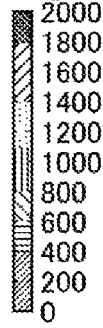
FIG. 5B is a diagram illustrating an effect (simulation result of the electric field intensity depending on the number of waveguide plates) by the plasma processing apparatus according to the first exemplary embodiment of the present disclosure.
Figure 5B:
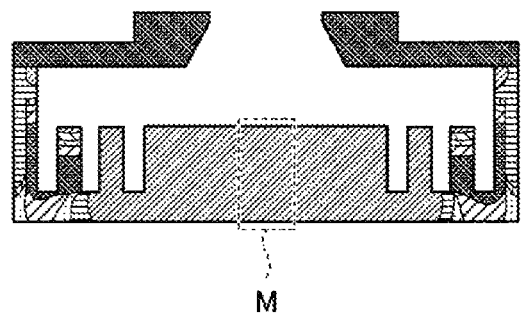
Figure 5C:
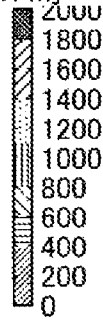
FIG. 5C is a diagram illustrating the effect (simulation result of the electric field intensity depending on the number of waveguide plates) by the plasma processing apparatus according to the first exemplary embodiment of the present disclosure.
Figure 5C:
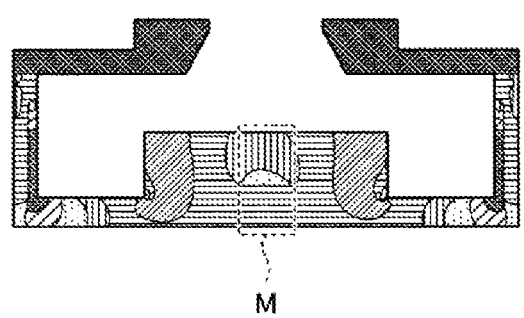
Figure 6:
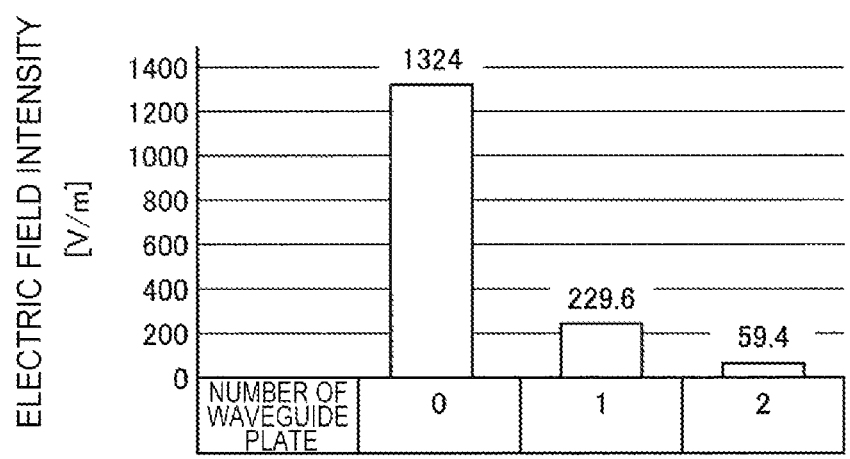
FIG. 6 is a diagram illustrating a simulation result in a measurement region M corresponding to a through-hole of a dielectric member, among the simulation results of FIGS. 5A to 5C.

FIGS. 5A to 5C and FIG. 6 are diagrams illustrating the effect (simulation result of the electric field intensity depending on the number of waveguide plates) by the plasma processing apparatus according to the first exemplary embodiment of the present disclosure. FIGS. 5A to 5C illustrate the simulation result of the electric field intensity depending on the number of waveguide plates in the simulation model 100 illustrated in FIG. 4A. The simulation result of FIG. 5A is a simulation result of electric field intensity around the injector 22 and the through-hole 16a of the dielectric member 16 when one waveguide plate 23 is disposed inside the injector, in the plasma processing apparatus 10 according to the first exemplary embodiment. The simulation result of FIG. 5B is a simulation result of electric field intensity around the injector 22 and the through-hole 16a of the dielectric member 16 when two waveguide plates 23 are disposed inside the injector 22, in the plasma processing apparatus 10 according to the first exemplary embodiment. Meanwhile, as a comparative example, the simulation result of FIG. 5C is a simulation result of electric field intensity around the injector 22 and the through-hole 16a of the dielectric member 16 when the waveguide plate 23 is not disposed inside the injector 22. FIG. 6 illustrates the simulation result in the measurement region M corresponding to the through-hole 16a of the dielectric member 16, among the simulation results of FIGS. 5A to 5C.

As illustrated in FIG. 5C and FIG. 6, when the waveguide plate 23 is not disposed, the electric field intensity of the measurement region M, that is, the electric field intensity of the through-hole 16a of the dielectric member 16 is set to be '1324.0' (V/m) and thus does not meet predefined allowable specifications. The reason is that among the microwaves propagated into the dielectric member 16 toward the through-hole 16a, the microwave reaching the through-hole 16a by climbing over the protruding part 22b of the injector 22 is increased.

In connection with this, as illustrated in FIG. 5A and FIG. 6, when one waveguide plate 23 is disposed, the electric field intensity of the measurement region M, that is, the electric field intensity of the through-hole 16a of the dielectric member 16 is set to be '229.6' (V/m) and thus meets predefined allowable specifications. Further, as illustrated in FIG. 5B and FIG. 6, when two waveguide plates 23 are disposed, the electric field intensity of the through-hole 16a of the dielectric member 16 is set to be '59.4' (V/m) and thus meets predefined allowable specifications. That is, it is possible to suppress the microwave reaching the through-hole 16a by climbing over the protruding part 22b of the injector 22 from increasing by disposing the waveguide plate 23. As the result, comparing the case in which one waveguide plate 23 is disposed with the case when the waveguide plate 23 is not disposed, the electric field intensity of the through-hole 16a of the dielectric member 16 may be reduced. Further, comparing the case in which two waveguide plates 23 are disposed with the case when one waveguide plate 23 is disposed, the electric field intensity of the through-hole 16a of the dielectric member 16 may be more and more reduced.

Figure 7A:
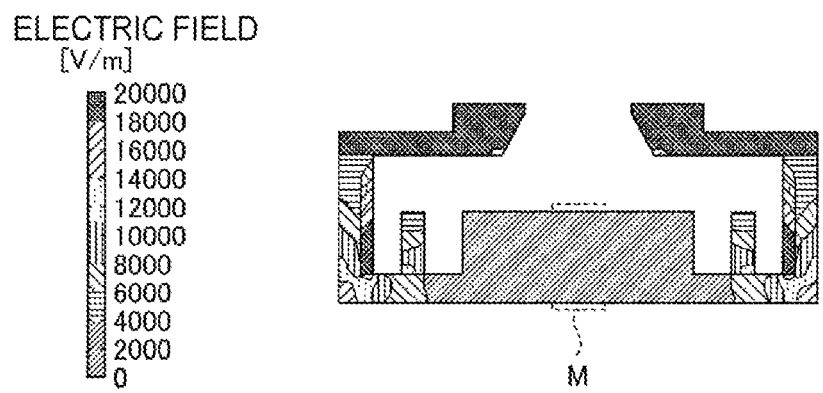
FIG. 7A is a diagram illustrating the effect (simulation result of the electric field intensity depending on the number of waveguide plates) by the plasma processing apparatus according to the first exemplary embodiment of the present disclosure.
Figure 7B:
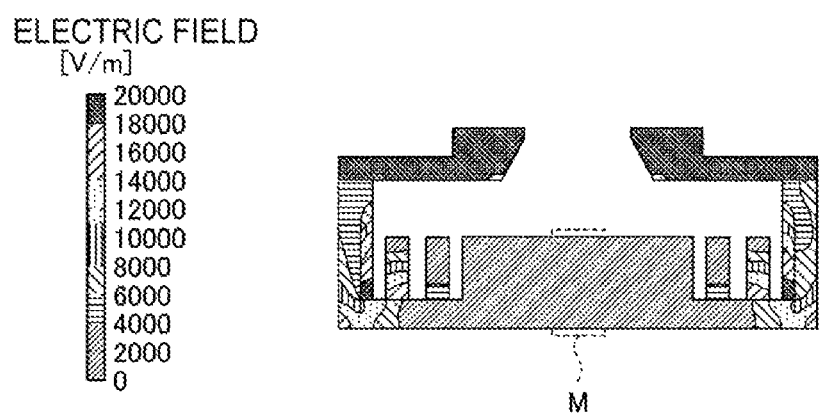
FIG. 7B is a diagram illustrating the effect (simulation result of the electric field intensity depending on the number of waveguide plates) by the plasma processing apparatus according to the first exemplary embodiment of the present disclosure.
Figure 7C:
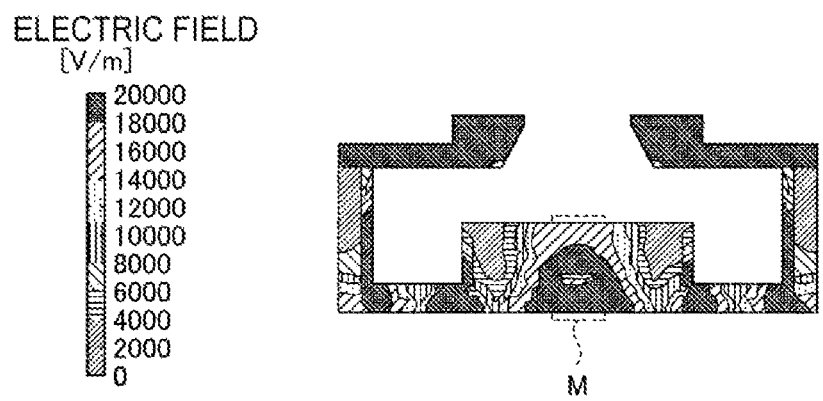
FIG. 7C is a diagram illustrating the effect (simulation result of the electric field intensity depending on the number of waveguide plates) by the plasma processing apparatus according to the first exemplary embodiment of the present disclosure.
Figure 8:
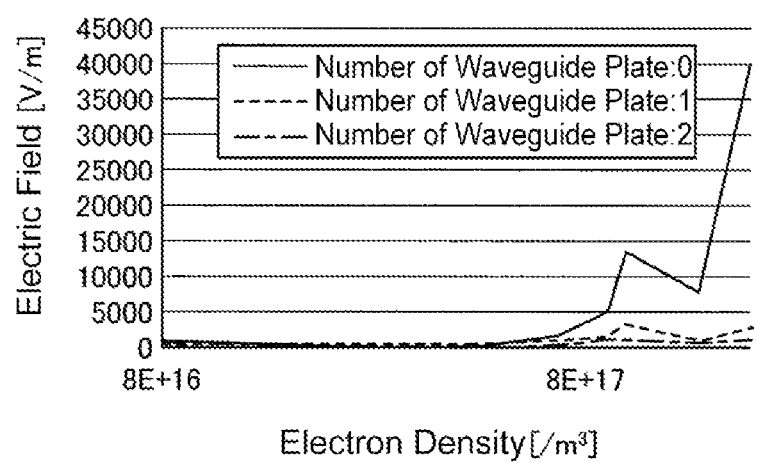
FIG. 8 is a diagram illustrating a simulation result in a measurement region M corresponding to a through-hole of a dielectric member, among the simulation results of FIGS. 7A to 7C.

FIGS. 7A to 7C and FIG. 8 are diagrams illustrating the effect (simulation result of the electric field intensity depending on the number of waveguide plates) by the plasma processing apparatus according to the first exemplary embodiment of the present disclosure. FIGS. 7A to 7C illustrate the simulation result of the electric field intensity depending on the number of waveguide plates in the simulation model 200 illustrated in FIG. 4B. The simulation result of FIG. 7A is a simulation result of electric field intensity around the injector 22 and the through-hole 16a of the dielectric member 16 when one waveguide plate 23 is disposed inside the injector 22, in the plasma processing apparatus according to the first exemplary embodiment. The simulation result of FIG. 7B is a simulation result of electric field intensity around the injector 22 and the through-hole 16a of the dielectric member 16 when two waveguide plates 23 are disposed inside the injector 22, in the plasma processing apparatus according to the first exemplary embodiment. Meanwhile, as a comparative example, the simulation result of FIG. 7C is a simulation result of electric field intensity around the injector 22 and the through-hole 16a of the dielectric member 16 when the waveguide plate 23 is not disposed inside the injector 22. FIG. 8 illustrates the simulation result in the measurement region M corresponding to the through-hole 16a of the dielectric member 16, among the simulation results of FIGS. 7A to 7C. In FIG. 8, a horizontal axis represents the electron density (number/m$^3$) applied to the model 204 of the simulation model 200 and a vertical axis represents the electric field intensity (V/m). Meanwhile, a region surrounded by a broken line of FIG. 8 corresponds to the measurement region M in FIGS. 5A to 5C.

As illustrated in FIGS. 7A to 7C and FIG. 8, comparing the case in which one waveguide plate 23 is disposed with the case when the waveguide plate 23 is not disposed, the electric field intensity of the through-hole 16a of the dielectric member 16 may be reduced. Further, comparing the case in which two waveguide plates 23 are disposed with the case when one waveguide plate 23 is disposed, the electric field intensity of the through-hole 16a of the dielectric member 16 may be more and more reduced. That is, the simulation result using the simulation model 200 in which the electron density of the processing space S is set may obtain the same tendency as the simulation result using the simulation model 100 in which the electron density of the processing space S is not set.

Figure 9A:
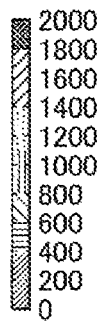
FIG. 9A is a diagram illustrating the effect (simulation result of the electric field intensity depending on a thickness of the waveguide plate) by a plasma processing apparatus according to the first exemplary embodiment of the present disclosure.
Figure 9A:
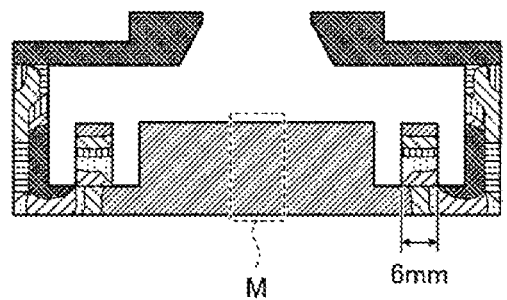
Figure 9B:
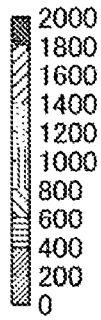
FIG. 9B is a diagram illustrating the effect (simulation result of the electric field intensity depending on the thickness of the waveguide plate) by a plasma processing apparatus according to the first exemplary embodiment of the present disclosure.
Figure 9B:
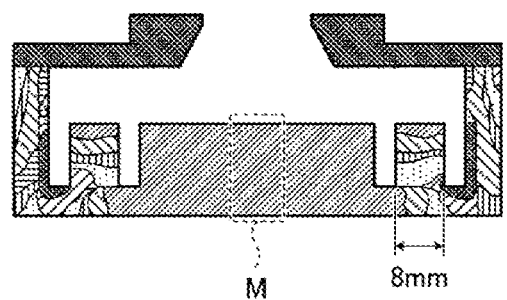

FIGS. 9A to 9F and FIG. 10 are diagrams illustrating the effect (simulation result of the electric field intensity depending on the thickness of waveguide plates) by the plasma processing apparatus according to the first exemplary embodiment of the present disclosure. FIGS. 9A to 9F illustrate the simulation results of the electric field intensity depending on the thickness of waveguide plates in the simulation model 100 illustrated in FIG. 4A. The simulation results of FIGS. 9A and 9B are the premise on the plasma processing apparatus 10 in which in FIGS. 2 and 3, the inside of the injector 22 is provided with one waveguide plate 23 and the waveguide plate 23 and the dielectric member 16 are made of alumina. In the premised plasma processing apparatus 10, the wavelength λ of the microwave propagated into the waveguide plate 23 is 39 mm.

In the premised plasma processing apparatus 10, the simulation result of FIG. 9A is the simulation result of the electric field intensity around the injector 22 and the through-hole 16a of the dielectric member 16 in the case in which the thickness t of the waveguide plate 23 is set to be 6 mm which is between λ/8 and λ/4. In the premised plasma processing apparatus 10, the simulation result of FIG. 9B is the simulation result of the electric field intensity around the injector 22 and the through-hole 16a of the dielectric member 16 in the case in which the thickness t of the waveguide plate 23 is set to be 8 mm which is between λ/8 and λ/4.

Figure 9C:
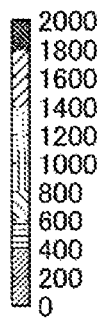
FIG. 9C is a diagram illustrating the effect (simulation result of the electric field intensity depending on the thickness of the waveguide plate) by the plasma processing apparatus according to the first exemplary embodiment of the present disclosure.
Figure 9C:
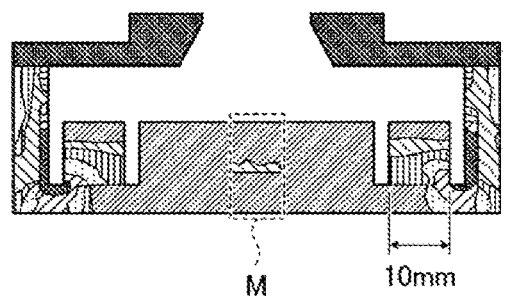
Figure 9D:
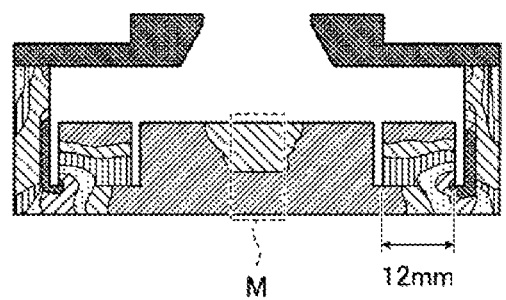
FIG. 9D is a diagram illustrating the effect (simulation result of electric field intensity depending on the thickness of the waveguide plate) by the plasma processing apparatus according to the first exemplary embodiment of the present disclosure.
Figure 9E:
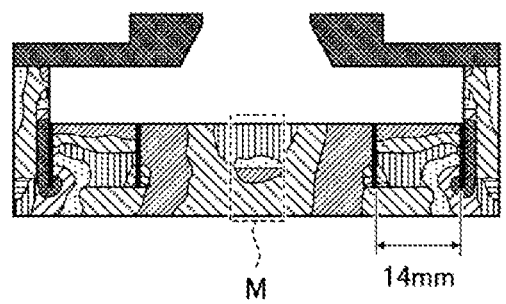
FIG. 9E is a diagram illustrating the effect (simulation result of the electric field intensity depending on the thickness of the waveguide plate) by the plasma processing apparatus according to the first exemplary embodiment of the present disclosure.

Meanwhile, in the premised plasma processing apparatus 10, as a comparative example, the simulation result of FIG. 9C is the simulation result of the electric field intensity around the injector 22 and the through-hole 16a of the dielectric member 16 in the case in which the thickness t of the waveguide plate 23 is set to be 10 mm which exceeds λ/4. In the premised plasma processing apparatus 10, as a comparative example, the simulation result of FIG. 9D is the simulation result of the electric field intensity around the injector 22 and the through-hole 16a of the dielectric member 16 in the case in which the thickness t of the waveguide plate 23 is set to be 12 mm which exceeds λ/4. In the premised plasma processing apparatus 10, as a comparative example, the simulation result of FIG. 9E is the simulation result of the electric field intensity around the injector 22 and the through-hole 16a of the dielectric member 16 in the case in which the thickness t of the waveguide plate 23 is set to be 14 mm which exceeds λ/4. In the premised plasma processing apparatus 10, as a comparative example, the simulation result of FIG. 9F is the simulation result of the electric field intensity around the injector 22 and the through-hole 16a of the dielectric member 16 in the case in which the thickness t of the waveguide plate 23 is set to be 2 mm which is smaller than λ/8.

Figure 9F:
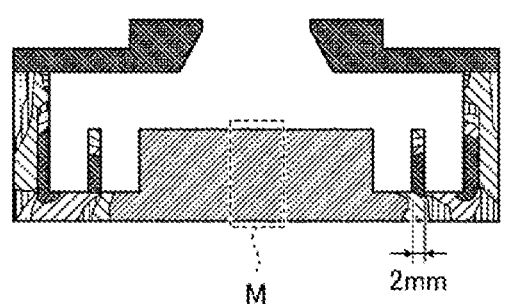
FIG. 9F is a diagram illustrating the effect (simulation result of the electric field intensity depending on the thickness of the waveguide plate) by the plasma processing apparatus according to the first exemplary embodiment of the present disclosure.
Figure 10:
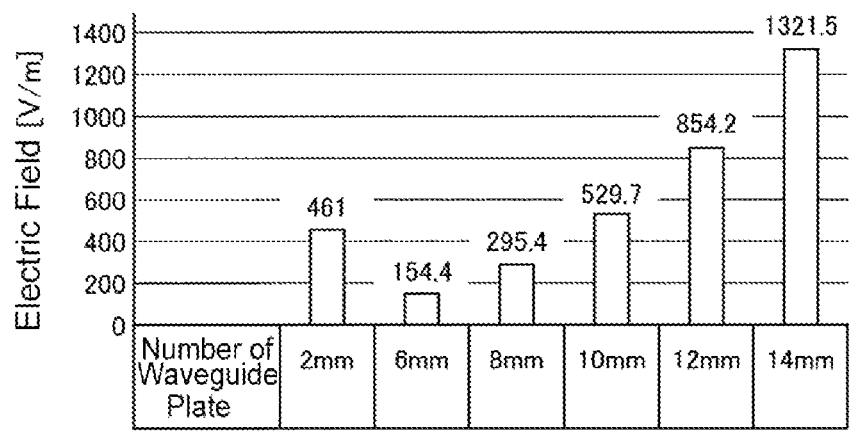
FIG. 10 is a diagram illustrating a simulation result in a measurement region M corresponding to a through-hole of a dielectric member, among the simulation results of FIGS. 9A to 9F.

FIG. 10 illustrates the simulation result in the measurement region M corresponding to the through-hole 16a of the dielectric member 16, among the simulation results of FIGS. 9A to 9F.

As illustrated in FIGS. 9C to 9E and FIG. 10, when the thickness t of the waveguide plate 23 is set to be a value which exceeds λ/4, the electric field intensity of the measurement region M, that is, the electric field intensity of the through-hole 16a of the dielectric member 16 is equal to or more than '529.7' V/m. The electric field intensity of the through-hole 16a of the dielectric member 16 does not meet the predefined allowable specifications. The reason is that the microwave guided to the inside of the injector 22 through the waveguide plate 23 is again leaked to the outside of the waveguide plate 23 and thus the microwave reaching the through-hole 16a of the dielectric member 16 is increased.

As illustrated in FIG. 9F and FIG. 10, when the thickness t of the waveguide plate 23 is set to be a value which is smaller than λ/8, the electric field intensity of the measurement region M, that is, the electric field intensity of the through-hole 16a of the dielectric member 16 is equal to or more than '461.0' V/m. The electric field intensity of the through-hole 16a of the dielectric member 16 does not meet the predefined allowable specifications. The reason is that the microwave is hardly guided to the inside of the injector 22 through the waveguide plate 23 and thus the microwave reaching the through-hole 16a of the dielectric member 16 is increased.

In connection with this, as illustrated in FIGS. 9A and 9B and FIG. 10, when the thickness t of the waveguide plate 23 is between λ/8 and λ/4, the electric field intensity of the measurement region M, that is, the electric field intensity of the through-hole 16a of the dielectric member 16 is '154.4' V/m or '295.4' V/m. The electric field intensity of the through-hole 16a of the dielectric member 16 meets the predefined allowable specifications. That is, it is confirmed that the thickness t of the waveguide plate 23 is between λ/8 and λ/4 and thus the microwave is easily guided to the inside of the injector 22 through the waveguide plate 23. As the result, when the thickness t of the waveguide plate 23 is between $\lambda/8$ and $\lambda/4$, comparing the case in which the thickness t of the waveguide plate 23 is set to be exceed $\lambda/4$ with the case in which the thickness t of the waveguide plate 23 is set to be smaller than $\lambda/8$, the electric field intensity of the through-hole 16a of the dielectric member 16 may be reduced.

As described above, according to the plasma processing apparatus of the first exemplary embodiment, the waveguide plate 23 is disposed inside the injector 22 to be able to suppress the increase in the microwave which reaches the through-hole 16a of the dielectric member 16. As the result, according to the first exemplary embodiment, electric field intensity of the through-hole 16a of the dielectric member 16 which is a path through which the processing gas in a plasma state is supplied may be reduced, such that it is possible to prevent abnormal discharge from occurring in the through-hole 16a.

(Second Exemplary Embodiment)

Figure 12:
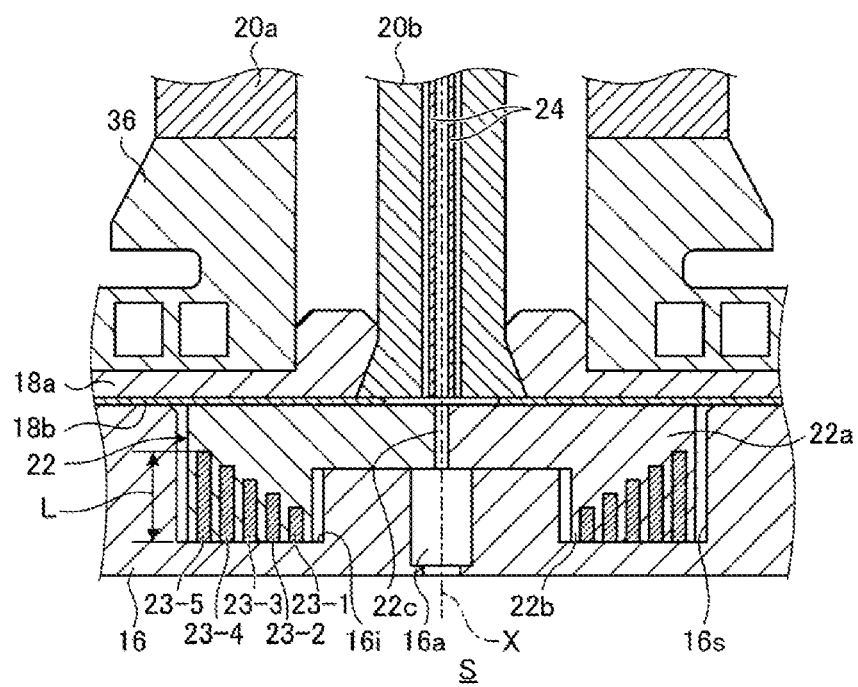
FIG. 12 is an enlarged cross-sectional view of an injector and a through-hole of a dielectric member according to a second exemplary embodiment of the present disclosure.

Next, a plasma processing apparatus according to a second exemplary embodiment will be described. FIG. 12 is an enlarged cross-sectional view of an injector and a through-hole of a dielectric member according to a second exemplary embodiment of the present disclosure. The plasma processing apparatus according to the second exemplary embodiment is different from the plasma processing apparatus according to the first exemplary embodiment only in terms of the shapes of the plurality of waveguide plates 23 disposed inside the injector 22 and other components thereof are the same as those of the plasma processing apparatus according to the first exemplary embodiment. Therefore, a description of the same components as the first exemplary embodiment will be omitted below.

As illustrated in FIG. 12, in the plasma processing apparatus according to the second exemplary embodiment, similar to the first exemplary embodiment, the waveguide plate 23 is disposed inside the injector in plural along the direction away from the through-hole 16a of the dielectric member 16, that is, the diameter direction of the disk-shaped injector 22. In the present exemplary embodiment, five waveguide plates 23 are disposed inside the injector 22 along the disk-shaped injector 22. In an example illustrated in FIG. 12, five waveguide plates 23 are illustrated as a waveguide plate 23-1, a waveguide plate 23-2, a waveguide plate 23-3, a waveguide plate 23-4, and a waveguide plate 23-5 from a central side along the diameter direction of the injector 22.

Herein, in the second exemplary embodiment, at least one of the plurality of waveguide plates 23 has a height different from that of another waveguide plate 23 which is adjacent to the at least one waveguide plate 23. For example, the plurality of waveguide plates 23 have an increasing height as being away from the central side along the diameter direction of the injector 22. In an example illustrated in FIG. 12, the heights L of the waveguide plates 23 have increased in an order of the waveguide plate 23-1, the waveguide plate 23-2, the waveguide plate 23-3, the waveguide plate 23-4, and the waveguide plate 23-5 from the central side along the diameter direction of the injector 22.

According to the present exemplary embodiment, by making the height of at least one waveguide plate 23 different from the height of another waveguide plate 23 which is adjacent to the at least one waveguide plate 23, the microwaves is guided from one end surface of the waveguide plate 23 to the inside of the injector 22 and a phase thereof reflected from the other end surface of the waveguide plate 23 may be diversified. In other words, according to the present exemplary embodiment, reflected waves of a plurality of microwaves having different phases may be generated by using the plurality of waveguide plates 23. Therefore, according to the present exemplary embodiment, progressive waves of the microwaves propagated into the dielectric member 16 toward the through-hole 16a may be efficiently offset by the reflected waves of the plurality of microwaves having different phases. As the result, according to the present exemplary embodiment, the electric field intensity of the through-hole 16a of the dielectric member 16 which is a path through which the processing gas in a plasma state is supplied may be efficiently reduced, such that it is possible to stably prevent the abnormal discharge from occurring in the through-hole 16a.

Figure 13:
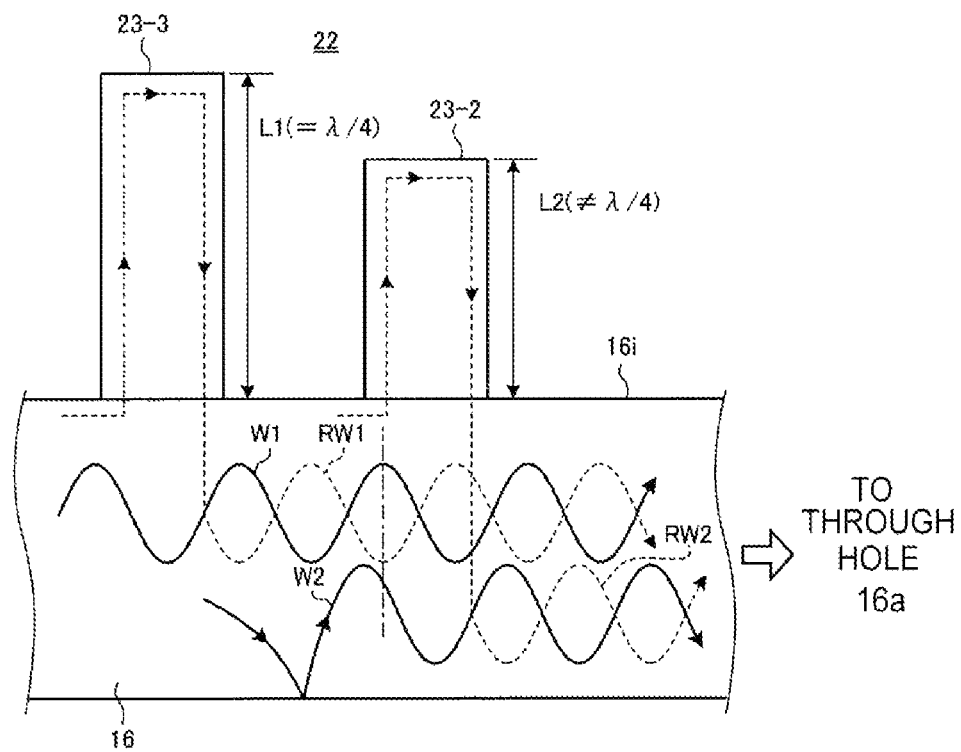
FIG. 13 is an explanation view for explaining an offset mechanism of a microwave.

Herein, referring to FIG. 13, when the height of the at least one waveguide plate 23 is different from that of another waveguide plate 23 which is adjacent to the at least one waveguide plate 23, the offset mechanism of the microwaves will be described. FIG. 13 is an explanation view for explaining an offset mechanism of a microwave. FIG. 13 illustrates the waveguide plate 23-2 and the waveguide plate 23-3 among the plurality of waveguide plates 23. In FIG. 13, when the wavelength of the microwave propagated into the waveguide plate 23 is set to be $\lambda$, it is assumed that a height L1 of the waveguide plate 23-3 of the plurality of waveguide plates 23 is set to be $\lambda/4$ and a height L2 of the waveguide plate 23-2 is different from the height L1 of the waveguide plate 23-3.

In the example illustrated in FIG. 13, as the microwave propagated into the dielectric member 16 toward the through-hole 16a, a progressive wave W1, a progressive wave W2, a reflected wave RW1, and a reflected wave RW2 exist. The progressive wave W1 is a microwave propagated into the dielectric member 16 without being propagated to the inside of the injector 22 by the waveguide plate 23. Further, the progressive wave W2 is a microwave obtained by reflecting the progressive wave W1 to the plasma within the processing space S. Depending on the reflection by the plasma within the processing space S, the phase of the progressive wave W2 deviates from the phase of the progressive wave W1.

The reflected wave RW1 is a microwave which is guided from one end surface of the waveguide plate 23-3 exposed to the groove part 16i of the dielectric member 16 to the inside of the injector 22 and is reflected from the other end surface of the waveguide plate 23-3. Since the height L1 of the waveguide plate 23-3 is set to be $\lambda/4$, the phase of the reflected wave RW1 deviates as much as $\lambda/2$ (that is, $\pi$) with respect to the phase of the progressive wave W1 as illustrated in FIG. 13. For this reason, the progressive wave W1 is offset by the reflected wave RW1. However, since the phase of the progressive wave W2 deviates from the phase of the progressive wave W1, the progressive wave W2 is not offset by the reflected wave RW1.

The reflected wave RW2 is a microwave which is guided from one end surface of the waveguide plate 23-2 exposed to the groove part 16i of the dielectric member 16 to the inside of the injector 22 and is reflected from the other end surface of the waveguide plate 23-2. Since the height L2 of the waveguide plate 23-2 is different from the height L1 of the waveguide plate 23-3, the phase of the reflected wave RW2 is different from the phase of the reflected wave RW1. Herein, it is assumed that the phase of the reflected wave RW2 deviates as much as $\lambda/2$ (that is, $\pi$) with respect to the phase of the progressive wave W2. By doing so, the progressive wave W2 which is not offset by the reflected wave RW1 is offset by the reflected wave RW2.

As such, when the height of the waveguide plate 23-3 is different from the height of another waveguide wave 23-2 which is adjacent to the waveguide plate 23-3, it is possible to generate the reflected waves (for example, reflected waves RW1 and RW2) of the plurality of microwaves having different phases. As the generation number of reflected waves of the plurality of microwaves having different phases is increased, the possibility that the progressive waves (for example, progressive waves W1 and W2) of the microwaves propagated into the dielectric member 16 toward the through-hole 16a may be offset by the reflected waves has increased. Therefore, according to the present exemplary embodiment, by making the height of the at least one of the plurality of waveguide plates 23 different from the height of another waveguide plate 23 which is adjacent to the at least one waveguide plate 23, the reflected waves of the plurality of microwaves having different phases are generated by using the plurality of waveguide plates 23. Therefore, according to the present exemplary embodiment, the progressive waves of the microwaves propagated into the dielectric member 16 toward the through-hole 16a may be efficiently offset by the reflected waves of the plurality of microwaves having different phases. As the result, according to the present exemplary embodiment, the electric field intensity of the through-hole 16a of the dielectric member 16 which is a path through which the processing gas in a plasma state is supplied may be efficiently reduced, such that it is possible to stably prevent the abnormal discharge from occurring in the through-hole 16a.

Meanwhile, the foregoing description describes the example in which the plurality of waveguide plates 23 have an increasing height as being away from the central side along the diameter direction of the injector 22, but the present exemplary embodiment is not limited thereto. For example, the plurality of waveguide plates 23 may have a reducing height as being away from the central side along the diameter direction of the injector 22. Further, for example, the plurality of waveguide plates 23 may be randomly formed to have different heights. In short, at least one of the plurality of waveguide plates 23 may be formed to have a height different from that of another waveguide plate which is adjacent to the at least one waveguide plate.

Next, the effect (simulation result of the electric field intensity depending on the shapes of the plurality of waveguide plates) by the plasma processing apparatus according to the second exemplary embodiment will be described with reference to FIGS. 14A to 14D and FIG. 15. FIGS. 14A to 14D are diagrams illustrating the simulation model for verifying the effect by the plasma processing apparatus according to the second exemplary embodiment of the present disclosure.

Figure 14A:
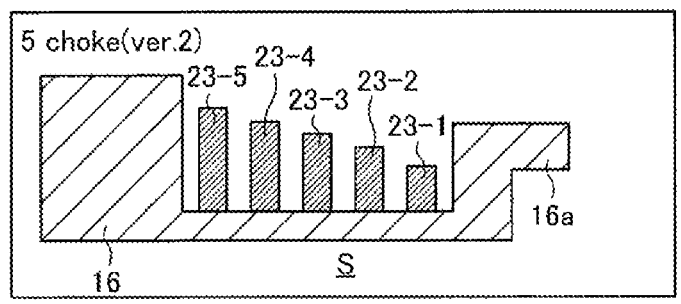
FIG. 14A is a diagram illustrating a simulation model for verifying an effect by a plasma processing apparatus according to a second exemplary embodiment of the present disclosure.
Figure 14B:
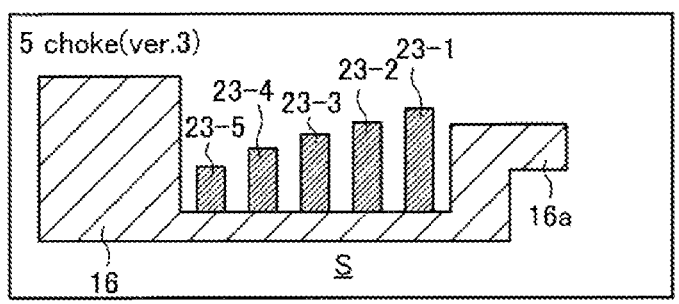
FIG. 14B is a diagram illustrating the simulation model for verifying the effect by the plasma processing apparatus according to the second exemplary embodiment of the present disclosure.

As illustrated in FIG. 14A, simulation model example 1 as Example 1 for verifying the effect by the plasma processing apparatus according to the second exemplary embodiment shows the case in which the plurality of waveguide plates 23 have the increasing height as being away from the central side along the diameter direction of the injector. Further, as illustrated in FIG. 14B, simulation model example 2 as Example 2 for verifying the effect by the plasma processing apparatus according to the second exemplary embodiment shows the case in which the plurality of waveguide plates 23 have the reducing height as being away from the central side along the diameter direction of the injector.

Figure 14C:
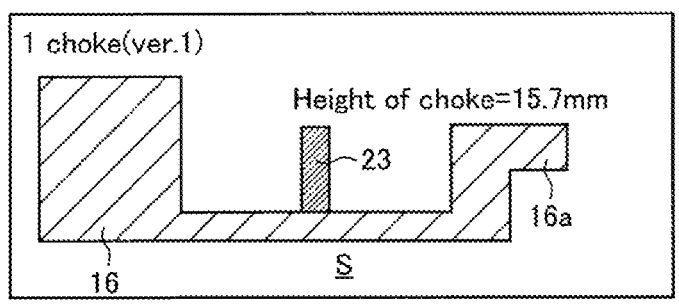
FIG. 14C is a diagram illustrating the simulation model for verifying the effect by the plasma processing apparatus according to the second exemplary embodiment of the present disclosure.
Figure 14D:
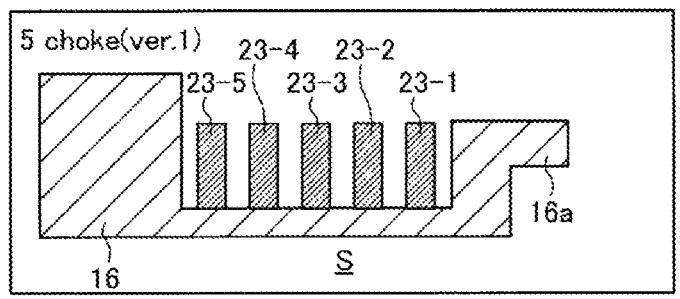
FIG. 14D is a diagram illustrating the simulation model for verifying the effect by the plasma processing apparatus according to the second exemplary embodiment of the present disclosure.

In connection with this, as illustrated in FIG. 14C, simulation model example 3 as Comparative Example 1 shows the case in which one waveguide plate 23 is disposed inside the injector. Further, as illustrated in FIG. 14D, simulation model example 4 as Comparative Example 2 shows the case in which the plurality of waveguide plates 23 have a constant height along the diameter direction of the injector.

Meanwhile, independent of any of the simulation conditions of simulation model examples 1 to 4, the power of the microwave input from an inlet port is set to be 3000 W.

Figure 15:
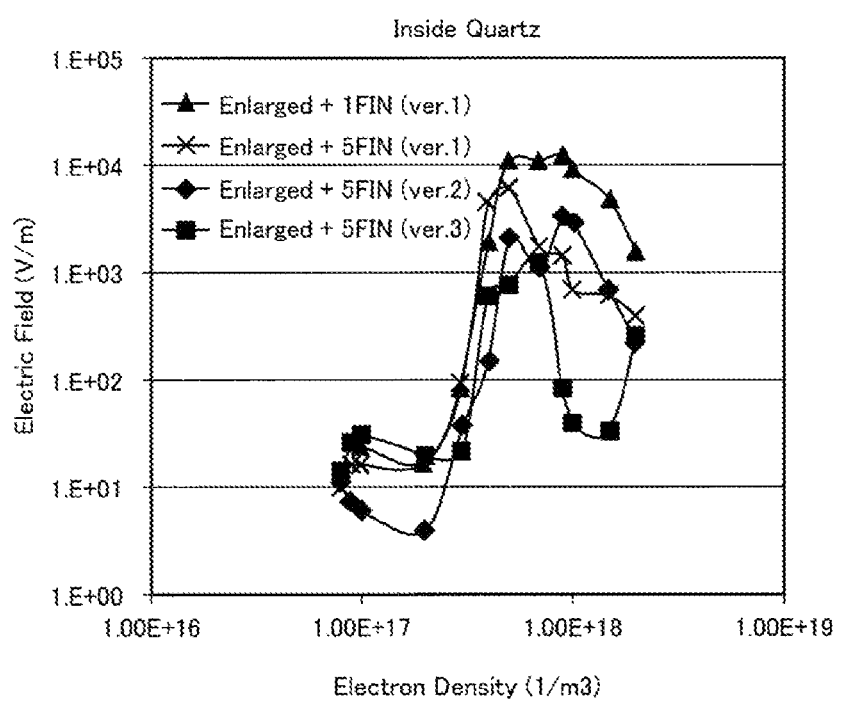
FIG. 15 is a diagram illustrating the effect (simulation result of electric field intensity depending on shapes of a plurality of waveguide plates) by the plasma processing apparatus according to the second exemplary embodiment of the present disclosure.

FIG. 15 is a diagram illustrating the effect (simulation result of electric field intensity depending on shapes of a plurality of waveguide plates) by the plasma processing apparatus according to the second exemplary embodiment of the present disclosure. FIG. 15 illustrates simulation results in Examples 1 and 2 illustrated in FIGS. 14A and 14B and Comparative Examples 1 and 2 illustrated in FIGS. 14C and 14D. In FIG. 15, 'Enlarged+1FIN (ver. 1)' is a simulation result in Comparative Example 1. Further, 'Enlarged+5FIN (ver. 1)' is a simulation result in Comparative Example 2. Further, 'Enlarged+5FIN (ver. 2)' is a simulation result in Example 1. Further, 'Enlarged+5FIN (ver. 3)' is a simulation result in Example 2. Meanwhile, in FIG. 15, a horizontal axis represents the electron density ($1/m^3$) of the processing space S and a vertical axis represents the electric field intensity (V/m) of the through-hole 16a of the dielectric member 16.

As illustrated in FIG. 15, in Examples 1 and 2 in which the height of at least one of the plurality of waveguide plates is different from that of another waveguide plate which is adjacent to the at least one waveguide plate, compared with Comparative Example 1 using one waveguide plate, the electric field intensity over a specific electron density range becomes small. Further, in Examples 1 and 2 in which the height of at least one of the plurality of waveguide plates is different from that of another waveguide plate which is adjacent to the at least one waveguide plate, compared with Comparative Example 2 using the plurality of waveguide plates having a constant height, the electric field intensity over a specific electron density range becomes small.

As such, as can be appreciated from the comparison of Comparative Examples 1 and 2 with Examples 1 and 2, in Examples 1 and 2, by making the height of at least one of the plurality of waveguide plates different from the height of another waveguide which is adjacent to the at least one waveguide plate, compared with the case in which one waveguide plate is used or the case in which the plurality of waveguide plates having a constant height are used, the electric field intensity of the through-hole 16a of the dielectric member 16 may be reduced.

As described above, according to the plasma processing apparatus of the second exemplary embodiment, since the height of at least one of the plurality of waveguide plates 23 is different from the height of another waveguide plate which is adjacent to the at least one waveguide plate, the reflected waves of the plurality of microwaves having different phases may be generated using the plurality of waveguide plates 23. Therefore, according to the second exemplary embodiment, the progressive waves of the microwaves propagated into the dielectric member 16 toward the through-hole 16a may be efficiently offset by the reflected waves of the plurality of microwaves having different phases. As the result, according to the second exemplary embodiment, the electric field intensity of the through-hole 16a of the dielectric member 16 which is a path through which the processing gas in a plasma state is supplied may be efficiently reduced, such that it is possible to stably prevent the abnormal discharge from occurring in the through-hole 16a.

(Third Exemplary Embodiment)

Figure 16:
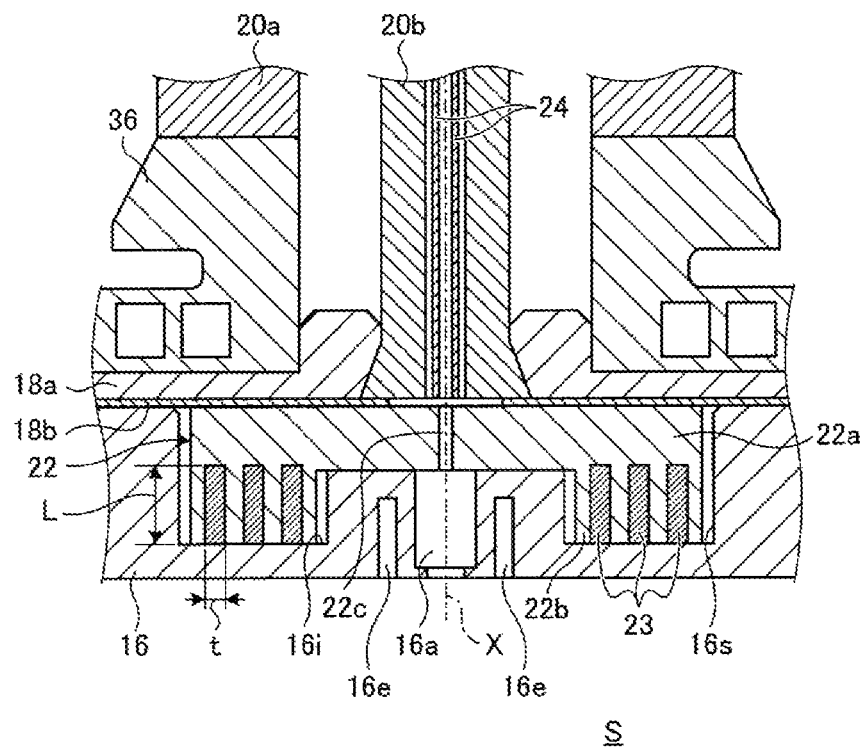
FIG. 16 is an enlarged cross-sectional view of an injector and a through-hole of a dielectric member according to a third exemplary embodiment of the present disclosure.

Next, a plasma processing apparatus according to a third exemplary embodiment will be described. FIG. 16 is an enlarged cross-sectional view of an injector and a through-hole of a dielectric member according to the third exemplary embodiment of the present disclosure. The plasma processing apparatus according to the third exemplary embodiment is different from the plasma processing apparatus according to the first exemplary embodiment in terms of the shape around the through-hole 16 of the dielectric member 16 and other components thereof are the same as those of the plasma processing apparatus according to the first exemplary embodiment. Therefore, a description of the same components as the first exemplary embodiment will be omitted below.

As illustrated in FIG. 16, in the plasma processing apparatus according to the third exemplary embodiment, the surface sealing the processing space S of the dielectric member 16 is provided with an annular groove part 16e formed to surround the through-hole 16a of the dielectric member 16. The groove part 16e has a function (hereinafter, referred to as 'waveguide function') of inducing the microwave propagated into the dielectric member 16 toward the through-hole 16a into the groove part 16e. The waveguide function of the groove part 16e increases the electric field intensity in the groove part 16e. Next, the generation of plasma is promoted in the groove part 16e, such that the microwave propagated into the dielectric member 16 toward the through-hole 16a is shielded by the plasma generated from the groove part 16e. The groove part 16e is an example of a second groove part.

Figure 17:
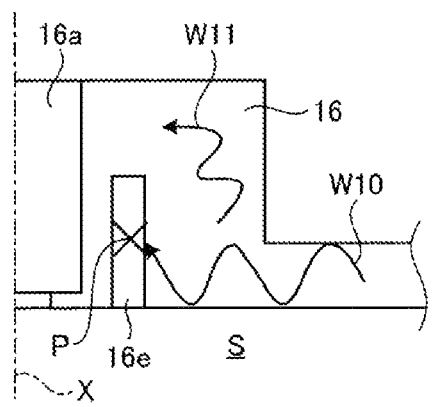
FIG. 17 is an explanation view for explaining a shielding mechanism of a microwave.

Here, a shielding mechanism of the microwave by the waveguide function of the groove part 16e will be described with reference to FIG. 17. FIG. 17 is an explanation view for explaining a shielding mechanism of a microwave.

When the electric field intensity is increased in the groove part 16e by the waveguide function of the groove part 16e, as illustrated in FIG. 17, the generation of plasma P from the groove part 16e is promoted. The plasma P generated from the groove part 16e shields a microwave W10 propagated into the dielectric member 16 toward the through-hole 16a. Therefore, the generation of a microwave W11 intruding into the through-hole 16a by climbing over the groove part 16e is suppressed. As the result, the electric field intensity of the through-hole 16a of the dielectric member 16 which is the path through which the processing gas in the plasma state is supplied is reduced, such that it is possible to prevent the abnormal discharge from occurring in the through-hole 16a.

Next, the effect (simulation result of the electric field intensity depending on the shape around the through-hole of the dielectric member) by the plasma processing apparatus according to the third exemplary embodiment will be described with reference to FIGS. 18A to 18D and FIG. 19. FIGS. 18A to 18D are diagrams illustrating the simulation model for verifying the effect by the plasma processing apparatus according to the third exemplary embodiment of the present disclosure.

Figure 18A:
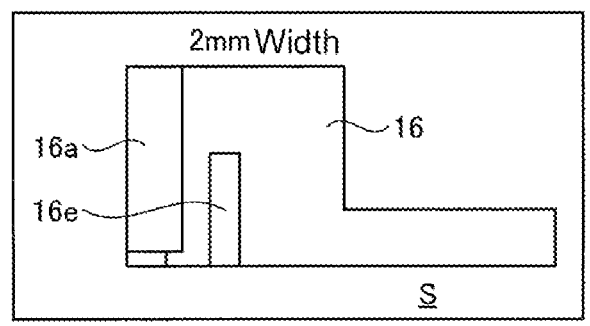
FIG. 18A is a diagram illustrating a simulation model for verifying an effect by a plasma processing apparatus according to the third exemplary embodiment of the present disclosure.
Figure 18B:
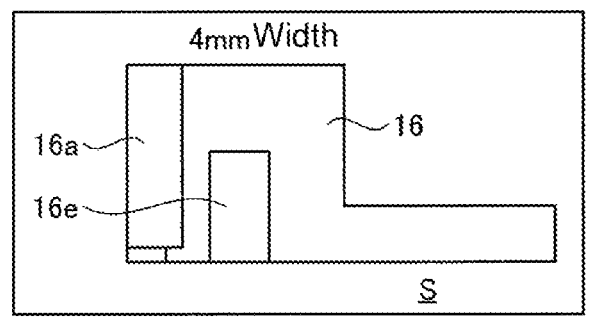
FIG. 18B is a diagram illustrating the simulation model for verifying the effect by the plasma processing apparatus according to the third exemplary embodiment of the present disclosure.
Figure 18C:
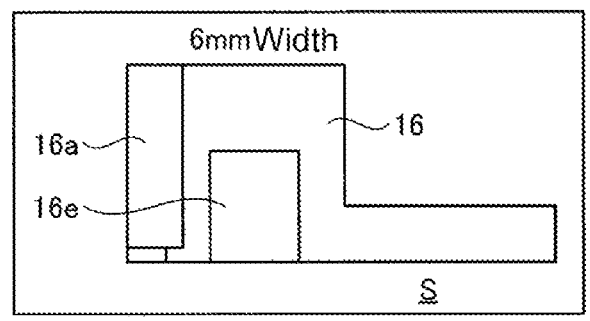
FIG. 18C is a diagram illustrating the simulation model for verifying the effect by the plasma processing apparatus according to the third exemplary embodiment of the present disclosure.

As illustrated in FIG. 18A, simulation model example 1 as Exemplary embodiment 1 for verifying the effect by the plasma processing apparatus according to the third exemplary embodiment shows the case in which the surface sealing the processing space S of the dielectric member 16 is provided with the groove part 16e having 2 mm in width to surround the through-hole 16a of the dielectric member 16. Further, as illustrated in FIG. 18B, simulation model example 2 as Example 2 for verifying the effect by the plasma processing apparatus according to the third exemplary embodiment shows the case in which the surface sealing the processing space S of the dielectric member 16 is provided with the groove part 16e having 4 mm in width to surround the through-hole 16a of the dielectric member 16. Further, as illustrated in FIG. 18C, simulation model example 1 as Example 3 for verifying the effect by the plasma processing apparatus according to the third exemplary embodiment shows the case in which the surface sealing the processing space S of the dielectric member 16 is provided with the groove part 16e having 6 mm in width to surround the through-hole 16a of the dielectric member 16.

Figure 18D:
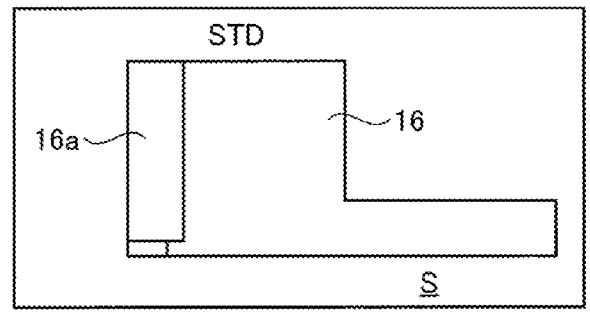
FIG. 18D is a diagram illustrating the simulation model for verifying the effect by the plasma processing apparatus according to the third exemplary embodiment of the present disclosure.

In connection with this, as illustrated in FIG. 18D, simulation model example 4 as Comparative Example 1 shows the case in which the groove part 16e of the dielectric member 16 is not formed.

Meanwhile, independent of any of the simulation conditions of simulation model examples 1 to 4, the power of the microwave input from an inlet port is set to be 3000 W.

Figure 19:
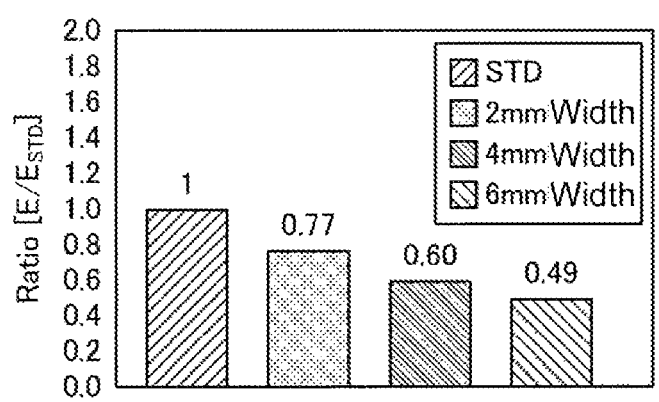
FIG. 19 is a diagram illustrating the effect (simulation result of electric field intensity depending on a shape around a through-hole of a dielectric member) by the plasma processing apparatus according to the third exemplary embodiment of the present disclosure.

FIG. 19 is a diagram illustrating the effect (simulation result of electric field intensity depending on a shape around a through-hole of a dielectric member) by the plasma processing apparatus according to the third exemplary embodiment of the present disclosure. FIG. 19 illustrates the simulation results in Examples 1 to 3 illustrated in FIGS. 18A to 18C and Comparative Example 1 illustrated in FIG. 18D. In FIG. 19, 'STD' shows the simulation result in Comparative Example 1. Further, '2 mm in width' is the simulation result in Example 1, '4 mm in width' is the simulation result in Example 2, and '6 mm in width' is the simulation result in Example 3. Meanwhile, in FIG. 15, a vertical axis represents a ratio of the electric field intensity of the through-hole 16a of the dielectric member 16 of Comparative Example 1 and Examples 1 to 3, respectively, in other words, the electric field intensity of the through-hole 16a of Examples 1 to 3, respectively, when the electric field intensity of the through-hole 16a of Comparative Example 1 is set to be 1.

As illustrated in FIG. 19, in Examples 1 to 3 in which the surface sealing the processing space S of the dielectric member 16 is provided with the groove part 16e to surround the through-hole 16a of the dielectric member 16, compared with Comparative Example 1 in which the groove part 16e is not formed, the electric field intensity of the through-hole 16a of the dielectric member 16 becomes small. Further, as the width of the groove part 16e is wide, the electric field intensity of the through-hole 16a of the dielectric member 16 becomes small.

As described above, according to the plasma processing apparatus of the third exemplary embodiment, since the surface sealing the processing space S of the dielectric member 16 is provided with the groove part 16e to surround the through-hole 16a of the dielectric member 16, the electric field intensity of the groove part 16e may be increased. For this reason, the generation of plasma is promoted in the groove part 16e, such that the microwave propagated into the dielectric member 16 toward the through-hole 16a is shielded by the plasma generated from the groove part 16e. As the result, according to the third exemplary embodiment, the electric field intensity of the through-hole 16a of the dielectric member 16 which is a path through which the processing gas in a plasma state is supplied may be efficiently reduced, such that it is possible to more stably prevent the abnormal discharge from occurring in the through-hole 16a.

As described above, several exemplary embodiments are described, but the concept of the present disclosure may configure various modified aspects. For example, the foregoing plasma processing apparatus 10 is a plasma processing apparatus using the microwave supplied from a radial line slot antenna as a plasma source, but the concept of the present disclosure may also be applied to another type of plasma processing apparatus. For example, in a surface wave plasma (SWP) type plasma processing apparatus, the foregoing injector and waveguide plate may be used within a dielectric window. Further, in an electron cyclotron resonance (ECR) type plasma processing apparatus, the foregoing injector and waveguide plate may be used within the dielectric window.

Figure 11:
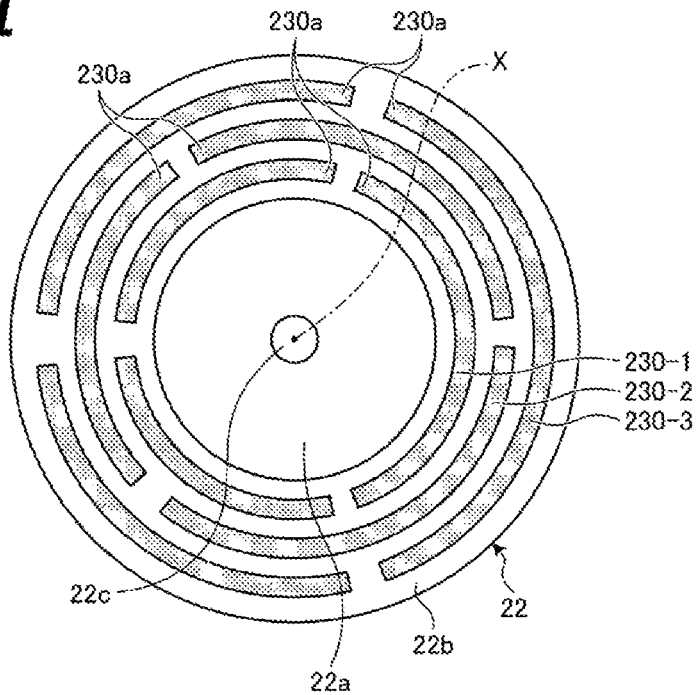
FIG. 11 is a plan view of an injector including a waveguide plate according to a modified example which is viewed from an X-axis direction.

The foregoing description describes an example of the exemplary embodiment in which the waveguide plate 23 is disposed inside the injector 22 in plural and the waveguide plates 23 are continuously formed in approximately a cylindrical shape using the X axis as the central axis, but the present exemplary embodiment is not limited thereto. Hereinafter, a modified example of the waveguide plate 23 will be described. FIG. 11 is a plan view of an injector including a waveguide plate according to a modified example which is viewed from an X-axis direction.

As illustrated in FIG. 11, a waveguide plate 230 is disposed inside the injector 22 in plural along the direction away from the through-hole 16a of the dielectric member 16, that is, the diameter direction of the disk-shaped injector 22. Meanwhile, for convenience of explanation, in the waveguide plate 230, one disposed in the innermost side along the diameter direction of the injector 22 is a waveguide plate 230-1. Further, in the waveguide plate 230, one disposed in the outermost side along the diameter direction of the injector 22 is a waveguide plate 230-3. Further, in the waveguide plate 230, one disposed between the waveguide plate 230-1 and the waveguide plate 230-3 is a waveguide plate 230-2. Further, the waveguide plates 230-1 to 230-3 are simply referred to as the waveguide plate 230 when not being specifically differentiated.

Each of the waveguide plates 230 includes a plurality of fragments 230a which are adjacent to each other at a predetermined gap along a direction going around the circumference of the through-hole 16a of the dielectric member 16, that is, a circumferential direction of the disk-shaped injector 22. Each of the fragments 230a is disposed at a position which shields a gap between other fragments 230a included in another waveguide plate 230. For example, the fragments 230a included in a waveguide plate 230-1 are disposed at a position which shields a gap between the fragments 230a included in a waveguide plate 230-2. Further, the fragments 230a included in a waveguide plate 230-2 are disposed at a position which shields a gap between the fragments 230a included in a waveguide plate 230-3. As such, the waveguide plates 230 according to the modified example are not continuously formed in approximately a cylindrical shape, but the plurality of fragments 230a are disposed along the circumferential direction of the disk-shaped injector 22.

According to the waveguide plate 230 according to the modified example, the plurality of fragments 230a are disposed along the circumferential direction of the injector 22, such that the microwave propagated into the dielectric member 16 may be locally guided to the inside of the injector 22 along the circumferential direction of the injector 22. For this reason, according to the waveguide plate 230 of the modified example, the increase in the microwave reaching the through-hole 16a of the dielectric member 16 may be suppressed. As the result, according to the waveguide plate 230 of the modified example, the electric field intensity of the through-hole 16a of the dielectric member 16 which is the path through which the processing gas in the plasma state is supplied may be more and more reduced, such that it is possible to efficiently prevent the abnormal discharge from occurring in the through-hole 16a.

The first and second exemplary embodiments describe the example in which the waveguide plate 23 is installed in the injector 22, but are not limited thereto. The waveguide plate 23 and the dielectric member 16 may be integrally formed. In this case, the waveguide plate 23 and the dielectric member 16 are integrally formed with each other so that the one end surface of the waveguide plate 23 exposed to the groove part 16i of the dielectric member 16 from the injector 22 is connected to the groove part 16i of the dielectric member 16.

The second exemplary embodiment describes another example in which at least one of the plurality of waveguide plates 23 has a height different from that of another waveguide plate which is adjacent to the at least one waveguide plate, but is not limited thereto. For example, at least one of the plurality of waveguide plates 23 may have a thickness different from that of another waveguide plate 23 which is adjacent to the at least one waveguide plate 23. Further, for example, at least one pair of waveguide plates 23 of the plurality of waveguide plates 23 may have an interval different from that of another pair of waveguide plates 23 which is adjacent to the at least one pair of waveguide plates 23.

Figure 20:
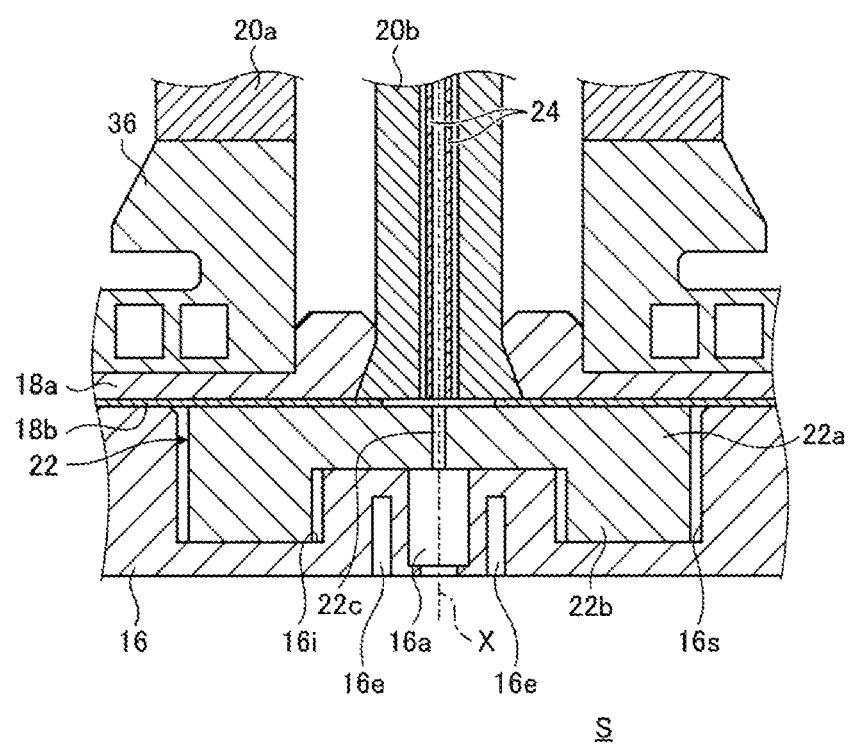
FIG. 20 is an enlarged cross-sectional view of an injector and a through-hole of a dielectric member according to Modified Example 1 of the third exemplary embodiment of the present disclosure.

The third exemplary embodiment describes the example in which the waveguide plate 23 made of a dielectric material is disposed inside the injector 22 and the surface sealing the processing space S of the dielectric member 16 is provided with the groove part 16e, but is not limited thereto. For example, the waveguide plate 23 made of a dielectric material may not be disposed inside the injector 22. Hereinafter, Modified Example 1 of the third exemplary embodiment will be described. FIG. 20 is an enlarged cross-sectional view of an injector and a through-hole of a dielectric member according to Modified Example 1 of the third exemplary embodiment of the present disclosure.

As illustrated in FIG. 20, in Modified Example 1 of the third exemplary embodiment, similar to the third exemplary embodiment, the surface sealing the processing space S of the dielectric member 16 is provided with the annular groove part 16e formed to surround the through-hole 16a of the dielectric member 16. However, in Modified Example 1 of the third exemplary embodiment, the waveguide plate 23 made of a dielectric material is not disposed inside the injector 22.

According to Modified Example 1 of the third exemplary embodiment, similar to the third exemplary embodiment, the electric field intensity of the through-hole 16a of the dielectric member 16 which is a path through which the processing gas in a plasma state is supplied may be efficiently reduced, such that it is possible to more stably prevent the abnormal discharge from occurring in the through-hole 16a.

Figure 21:
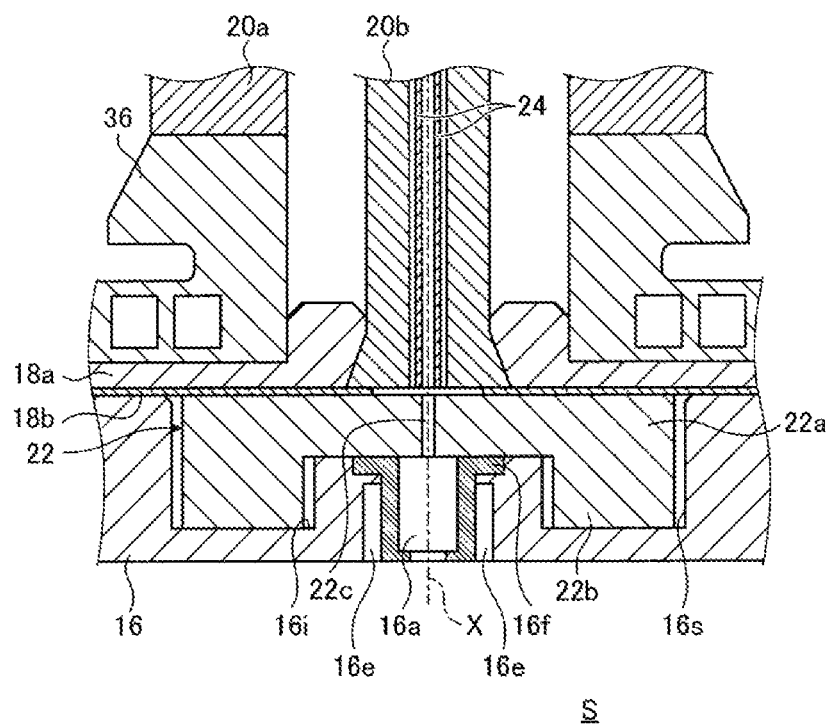
FIG. 21 is an enlarged cross-sectional view of an injector and a through-hole of a dielectric member according to Modified Example 2 of the third exemplary embodiment of the present disclosure.

Modified Example 1 of the third exemplary embodiment describes the example in which the dielectric member 16 is made of one dielectric material, but is not limited thereto. For example, a main body of the dielectric member 16 and a member provided with the through-hole 16a may be formed as separate members. Hereinafter, Modified Example 2 of the third exemplary embodiment will be described. FIG. 21 is an enlarged cross-sectional view of an injector and a through-hole of a dielectric member according to Modified Example 2 of the third exemplary embodiment of the present disclosure.

In the dielectric member 16 illustrated in FIG. 21, the through-hole 16a is formed in a member 16f that is detachably attached to the dielectric member 16, is a portion of the dielectric member 16 and is made of a dielectric material.

According to Modified Example 1 of the third exemplary embodiment, it is possible to easily replace the member 16f provided with the through-hole 16a while preventing the abnormal discharge from occurring in the through-hole 16a.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing chamber configured to partition a processing space;

a microwave generator configured to generate microwaves for plasma excitation;

a dielectric member mounted in the processing chamber so as to seal the processing space, and configured to introduce the microwaves generated by the microwave generator into the processing space;

an injector made of conductive material and mounted along a central axis in the dielectric member, and further configured to supply a processing gas to the processing space through a through-hole formed in the dielectric member; and a waveguide plate made of a dielectric material and mounted in the injector, and configured to guide the microwaves propagated into the dielectric member toward the through-hole, to an inside of the injector, wherein the dielectric member is provided with a receiving concave part which is formed on a surface opposite to a surface sealing the processing space of the dielectric member to receive the injector, the receiving concave part is disposed above the through-hole through which the receiving concave part is communicated with the processing space, the receiving concave part provided with a first annular groove part to surround the through-hole, the injector is provided with a body part including an additional through-hole for supplying the processing gas to the through-hole of the dielctric member and a protruding part which protrudes from the body part into the first annular groove part of the receiving concave part; and the waveguide plate is buried in the protruding part of the injector to be disposed inside the injector so as to surround the through-hole of the dielectric member.

2. The plasma processing apparatus of claim 1, wherein the surface sealing the processing space of the dielectric member is provided with a second groove part formed so as to surround the through-hole of the dielectric member.

3. The plasma processing apparatus of claim 1, wherein the waveguide plate is disposed in plural inside the injector along a direction away from the through-hole of the dielectric member.

4. The plasma processing apparatus of claim 3, wherein at least one of the plurality of waveguide plates has a height different from that of another waveguide plate which is adjacent to the at least one waveguide plate.

5. The plasma processing apparatus of claim 3, wherein at least one of the plurality of waveguide plates has a thickness different from that of another waveguide plate which is adjacent to the at least one waveguide plate.

6. The plasma processing apparatus of claim 3, wherein at least one pair of waveguide plates of the plurality of waveguide plates has an interval different from that of another pair of waveguide plates which is adjacent to the at least one pair of waveguide plates.

7. The plasma processing apparatus of claim 3, wherein each of the waveguide plates includes a plurality of fragments which are adjacent to each other at a predetermined gap along a direction going around the circumference of the through-hole of the dielectric member, and each of the fragments is disposed at a position which shields a gap between the fragments included in another waveguide plate.

8. The plasma processing apparatus of claim 1, wherein when a wavelength of the microwave propagated into the waveguide plate is set to be $\lambda$, a height of the waveguide plate is $\lambda/4$.

9. The plasma processing apparatus of claim 1, wherein when a wavelength of the microwave propagated into the waveguide plate is set to be $\lambda$, a thickness of the waveguide plate is between $\lambda/8$ and $\lambda/4$.

* * * * *